(12) United States Patent
Jeon et al.

(10) Patent No.: US 11,362,153 B2
(45) Date of Patent: Jun. 14, 2022

(54) DISPLAY DEVICE

(71) Applicant: Samsung Display Co., LTD., Yongin-si (KR)

(72) Inventors: Joo Hee Jeon, Hwaseong-si (KR); Gun Hee Kim, Seoul (KR); Sang Hoon Kim, Seoul (KR); Seung Chan Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 167 days.

(21) Appl. No.: 16/929,883

(22) Filed: Jul. 15, 2020

(65) Prior Publication Data

US 2021/0036070 A1 Feb. 4, 2021

(30) Foreign Application Priority Data

Aug. 1, 2019 (KR) .................. 10-2019-0093678

(51) Int. Cl.
*H01L 27/32* (2006.01)

(52) U.S. Cl.
CPC ...... *H01L 27/3227* (2013.01); *H01L 27/3276* (2013.01)

(58) Field of Classification Search
CPC ................ H01L 51/5203; H01L 2227/323
See application file for complete search history.

(56) References Cited

U.S. PATENT DOCUMENTS

| 9,349,780 | B2* | 5/2016 | Kim | H01L 27/3258 |
| 2014/0183479 | A1* | 7/2014 | Park | H01L 27/3218 438/34 |
| 2018/0315357 | A1* | 11/2018 | Nam | H01L 27/3223 |
| 2019/0058020 | A1 | 2/2019 | Tsai et al. | |
| 2019/0131365 | A1* | 5/2019 | Jung | H01L 27/1248 |
| 2019/0198585 | A1* | 6/2019 | Chang | H01L 27/14 |
| 2019/0296055 | A1* | 9/2019 | Lius | H01L 27/124 |
| 2019/0303639 | A1* | 10/2019 | He | G06V 40/1394 |

FOREIGN PATENT DOCUMENTS

| KR | 1020160130042 A | 11/2016 |
| KR | 1020170078909 A | 7/2017 |

* cited by examiner

*Primary Examiner* — Vongsavanh Sengdara
(74) *Attorney, Agent, or Firm* — Cantor Colburn LLP

(57) ABSTRACT

A display device includes: a substrate including a display area including a plurality of first pixels and a sensor area including a plurality of second pixels and a plurality of transmission portions, a plurality of first counter electrodes disposed corresponding to the plurality of first pixels, respectively, a plurality of second counter electrodes disposed corresponding to the plurality of second pixels, respectively, and a spacer disposed to overlap at least a portion of a boundary region between a transmission portion of the plurality of transmission portions and a second counter electrode of the plurality of second counter electrodes, which are adjacent to each other.

20 Claims, 16 Drawing Sheets

DISPLAY DEVICE

This application claims priority to Korean Patent Application No. 10-2019-0093678, filed on Aug. 1, 2019, and all the benefits accruing therefrom under 35 U.S.C. 119, the content of which in its entirety is herein incorporated by reference.

BACKGROUND

1. Field

The disclosure relates to a display device.

2. Description of the Related Art

As the information society develops, the demand for display devices for displaying images has increased and diversified. For example, display devices have been applied to various electronic devices such as smartphones, tablet personal computers ("PC"s), digital cameras, laptop computers, navigation devices, monitors and televisions ("TV"s). The display device may be a flat panel display device such as a liquid crystal display device a field emission display device, an organic light emitting display device and a quantum dot light emitting display device.

Recently, various methods for minimizing a non-display area and maximizing a display area of the display device have been studied. As one of such methods, there has been known a method of arranging various sensors included in the display device below the display panel rather than arranging the sensors by forming holes in the display panel. The display device in which the sensors are disposed below the display panel may include a pixel area for realizing an image and a sensor area having a transmission portion in which a sensor or the like may be disposed.

SUMMARY

Embodiments of the disclosure relate to a display device capable of maximally securing the transmission portion by preventing a shadow phenomenon by using a spacer when a cathode electrode is deposited using a mask such as a fine metal mask ("FMM").

According to an embodiment of the invention, a display device includes: a substrate including a display area including a plurality of first pixels and a sensor area including a plurality of second pixels and a plurality of transmission portions, a plurality of first counter electrodes disposed corresponding to the first plurality of pixels, respectively, a plurality of second counter electrodes disposed corresponding to the plurality of second pixels, respectively, and a spacer disposed to overlap at least a portion of a boundary region between a transmission portion of the plurality of transmission portions and a second counter electrode of the plurality of second counter electrodes, which are adjacent to each other.

In an embodiment, the spacer may include at least one organic material selected from polyimide, polyamide and acrylic resin and phenol resin.

In an embodiment, the display device may further include a component disposed below the transmission portion, the component may include a sensor which senses an infrared light, a visible light or a sound.

In an embodiment, an area of the plurality of transmission portions may be greater than an area of an emission region of the plurality of second pixels.

In an embodiment, the number of the plurality of second pixels per unit area may be smaller than the number of the plurality of first pixels per unit area.

In an embodiment, the plurality of first counter electrodes and the plurality of second counter electrodes may be electrically connected to each other.

In an embodiment, each of the plurality of first counter electrodes may have a first rectangular shape having a first width in a first direction and a first height in a second direction crossing the first direction, and each of the plurality of second counter electrodes may have a second rectangular shape with protrusions protruding in the first direction from four vertices of the second rectangular shape, where the second rectangular shape may have a second width in the first direction and a second height in the second direction.

In an embodiment, the first width may be greater than the second width, and the first height may be less than the second height.

In an embodiment, each of the plurality of transmission portion may have a third rectangular shape surrounded by the plurality of second counter electrodes.

In an embodiment, the third rectangular shape may have a third width in the first direction and may have a third height in the second direction.

In an embodiment, the third width may be greater than the first width and the second width.

In an embodiment, the spacer may have a predetermined width, and the spacer may be disposed to at least partially overlap a boundary region between the transmission portion and the protrusions of the second counter electrode in the first direction and a boundary region between the transmission portion and the second rectangular shape of the second counter electrode in the second direction.

In an embodiment, the spacer may have a predetermined width, and the spacer may be disposed along a perimeter of the third rectangular shape.

In an embodiment, each of the plurality of second counter electrodes may further include a curved portion at an intersection of a region of the protrusion extending in the first direction and a region of the second rectangular shape extending in the second direction.

In an embodiment, the spacer may have a triangular shape, and the spacer may be disposed to at least partially overlap the curved portion.

In an embodiment, adjacent first counter electrodes in the first direction, among the plurality of first counter electrodes, may overlap each other at an edge of the first rectangular shape, and adjacent second counter electrodes along an edge of the transmission portion, among the plurality of second counter electrodes, may overlap each other at the protrusion.

In an embodiment, adjacent first counter electrodes in the second direction, among the plurality of first counter electrodes, may be spaced apart from each other.

In an embodiment, the substrate may further include a non-display area disposed to surround the display area and the sensor area.

In an embodiment, a power supply wiring extending in the second direction may be disposed on the non-display area of the substrate.

In an embodiment, the first plurality of counter electrodes spaced apart from each other in the second direction may be electrically connected to each other through the power supply wiring.

According to embodiments of the disclosure, the transmission portion of a display device is effectively secured by preventing a shadow phenomenon by using a spacer when a cathode electrode is deposited using a mask such as an FMM.

BRIEF DESCRIPTION OF THE DRAWINGS

The above and other features of the disclosure will become more apparent by describing in detail exemplary embodiments thereof with reference to the attached drawings, in which.

DETAILED DESCRIPTION

Figure 1:
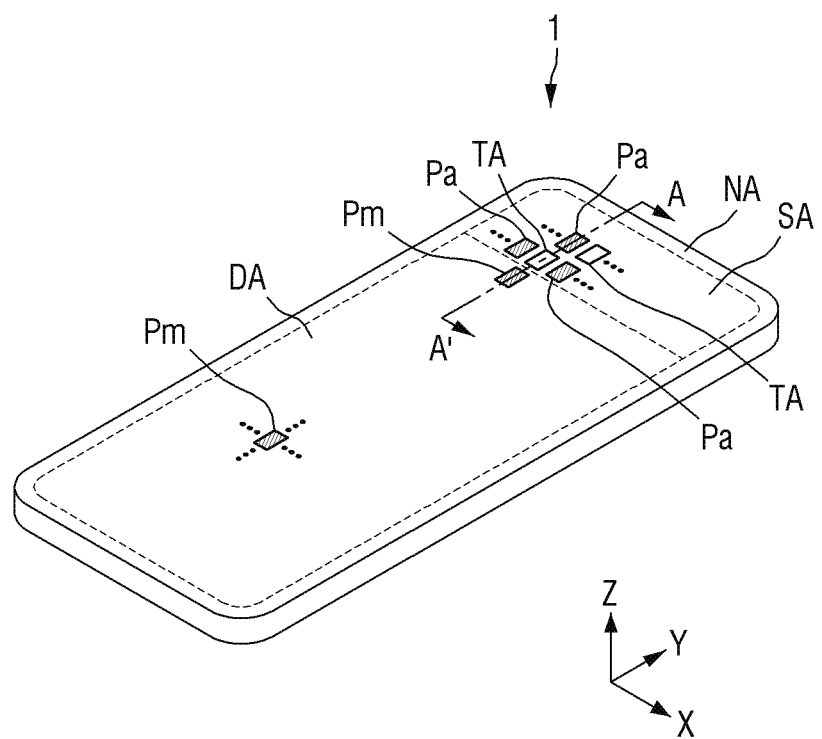
FIG. 1 is a perspective view schematically illustrating a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. As used herein, the singular forms "a," "an," and "the" are intended to include the plural forms, including "at least one," unless the content clearly indicates otherwise. "Or" means "and/or." Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a perspective view schematically illustrating a display device according to an exemplary embodiment of the disclosure.

Referring to FIG. 1, an exemplary embodiment of a display device 1 includes a display area DA on which an image is displayed and a non-display area NDA on which an image is not displayed. The display device 1 may provide a main image by using light emitted from a plurality of first pixels Pm disposed in the display area DA.

The display device 1 may include a sensor area SA. As described below with reference to FIG. 2, the sensor area SA may be an area in which a component such as a sensor using infrared light, visible light, sound, or the like is disposed. The sensor area SA may include a transmission portion TA, through which light or/and sound outputted from the component to the outside or traveling toward the component from the outside is allowed to be transmitted.

A plurality of second pixels Pa may be disposed therein and a predetermined image may be provided using light emitted from the plurality of second pixels Pa. The image provided from the sensor area SA may be an auxiliary image and may have a lower resolution than the image provided from the display area DA. In an exemplary embodiment, since the sensor area SA includes the transmission portion TA through which light or/and sound can be transmitted, the number of the second pixels Pa disposed in an unit area may be smaller than the number of the first pixels Pm disposed in an unit area in the display area DA.

The sensor area SA may be disposed on one side of the display area DA. FIG. 1 illustrates an exemplary embodiment where the sensor area SA is disposed above the display area DA, but not being limited thereto. Alternatively, the sensor area SA is disposed between the non-display area NDA and the display area DA.

Hereinafter, for convenience of description, an exemplary embodiment where the display device 1 is an organic light emitting display device will be described in detail, but the display device of the disclosure is not limited thereto. In an alternative exemplary embodiment, another type of display device such as an inorganic electroluminescent ("EL") display device or a quantum dot light emitting display device may be used as the display device 1.

FIG. 1 illustrates an exemplary embodiment where the sensor area SA is disposed above the display area DA which is rectangular, but the disclosure is not limited thereto. Alternatively, the shape of the display area DA may be a circular shape, an elliptical shape, or a polygonal shape such as a triangle or a pentagon, and the position and number of the sensor areas SA may be variously modified.

Figure 2:
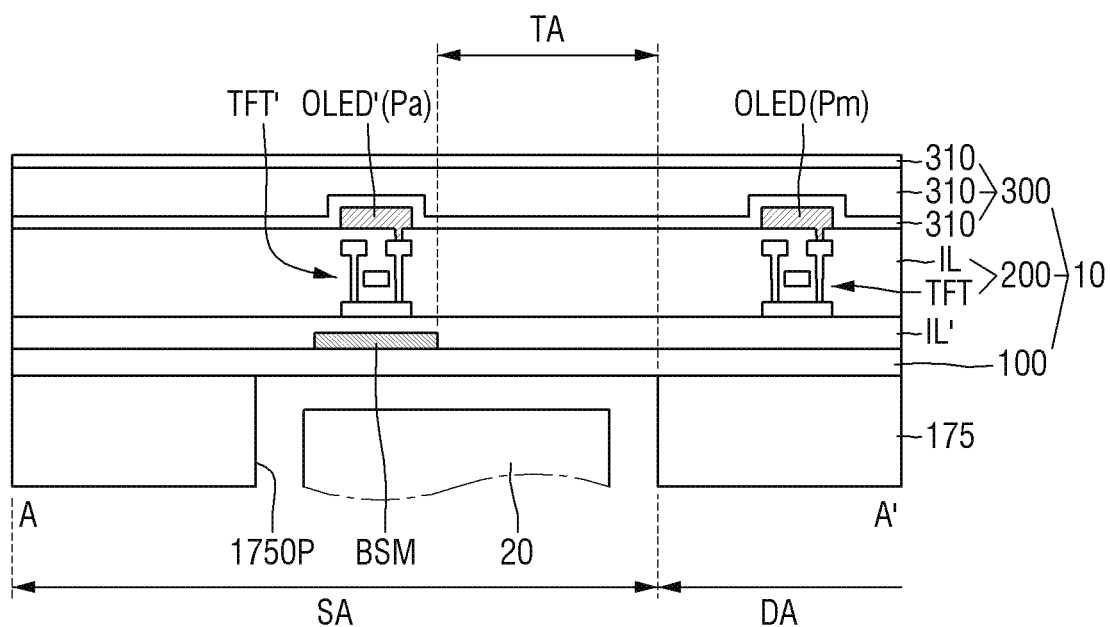
FIG. 2 is a cross-sectional view schematically illustrating a display device according to an exemplary embodiment of the disclosure.

FIG. 2 is a cross-sectional view schematically illustrating a display device according to an exemplary embodiment of the disclosure, corresponding to a cross section taken along line A-A' of FIG. 1.

Referring to FIG. 2, an exemplary embodiment of the display device 1 may include a display panel 10 including a display element, and a component 20 corresponding to the sensor area SA.

The display panel 10 may include a substrate 100, a display element layer 200 disposed on the substrate 100, and a thin film encapsulation layer 300 as a sealing member for sealing the display element layer 200. In an exemplary embodiment, the display panel 10 may further include a cover pad 175 disposed below the substrate 100.

The substrate 100 may include a glass or a polymer resin. In one exemplary embodiment, for example, the polymer resin may include polyethersulfone ("PES"), polyacrylate ("PA"), polyetherimide ("PEI"), polyethylene naphthalate ("PEN"), polyethylene terephthalate ("PET"), polyphenylene sulfide ("PPS"), polyarylate ("PAR") polyimide ("PI"), polycarbonate ("PC"), cellulose acetate propionate ("CAP"), or the like. The substrate 100 including the polymer resin may have flexible, rollable, or bendable characteristics. The substrate 100 may have a multilayer structure including a layer including the above-described polymer resin and an inorganic layer (not shown).

The display element layer 200 may include a circuit layer including thin film transistors TFT and TFT', an organic light emitting diode OLED as a display element, and insulating layers IL and IL', between which the thin film transistors TFT and TFT' and the organic light emitting diode OLED are disposed.

In an exemplary embodiment, a first pixel Pm including a main thin film transistor TFT and an organic light emitting diode OLED connected thereto may be disposed in the display area DA, and a second pixel Pa including an auxiliary thin film transistor TFT' and an organic light emitting diode OLED' connected thereto may be disposed in the sensor area SA.

In such an embodiment, the transmission portion TA, which does not include a display element and the auxiliary thin film transistor TFT', may be defined in the sensor area SA. The transmission portion TA may be understood as a region through which light/signal emitted from the component 20 or external light/signal to be incident on the component 20 is transmitted.

The component 20 may be located in the sensor area SA. The component 20 may be an electronic element using light or sound. In one exemplary embodiment, for example, the component 20 may be a sensor, such as an infrared sensor, which receives and uses light, a sensor which measures a distance or recognizes a fingerprint or the like by outputting and detecting light or sound, a small lamp which outputs light, a speaker which outputs sound, a camera which captures an image, or the like. In an embodiment, where the component 20 is an electronic element using light, light of various wavelength bands, such as visible light, infrared light and ultraviolet light may be used. A plurality of components 20 may be provided in the sensor area SA. In one exemplary embodiment, for example, a light emitting element and a light receiving element may be provided together in one sensor area SA as the components 20. Alternatively, both a light emitting portion and a light receiving portion may be provided in the component 20. In FIG. 2, for convenience of illustration and description, one component 20 is illustrated as corresponding to one second pixel Pa and one transmission portion TA, but not being limited thereto. Alternatively, one component 20 may be disposed to correspond to a plurality of second pixels Pa and a plurality of transmission portions TA.

A lower metal layer BSM may be disposed in the sensor area SA. The lower metal layer BSM may be disposed to correspond to the lower portion of the auxiliary thin film transistor TFT'. The lower metal layer BSM may prevent light from reaching the second pixel Pa including the auxiliary thin film transistor TFT' and the like. In one exemplary embodiment, for example, the lower metal layer BSM may block light emitted from the component 20 from reaching the second pixel Pa.

In an exemplary embodiment, a constant voltage or signal may be applied to the lower metal layer BSM to prevent damage to a pixel circuit due to electrostatic discharge.

The thin film encapsulation layer 300 may include an inorganic encapsulation layer and an organic encapsulation layer. In an exemplary embodiment, as shown in FIG. 2, the thin film encapsulation layer 300 includes first and second inorganic encapsulation layers 310 and 330 and an organic encapsulation layer 320 therebetween.

The first and second inorganic encapsulation layers 310 and 330 may include at least one inorganic insulating material selected from aluminum oxide, titanium oxide, tantalum oxide, hafnium oxide, zinc oxide, silicon oxide, silicon nitride and silicon oxynitride. The organic encapsulation layer 320 may include a polymer-based material. In one exemplary embodiment, for example, the polymer-based material may include acrylic resin, epoxy resin, polyimide, polyethylene or the like.

The cover pad 175 may be attached to the bottom of the substrate 100. An opening 175OP corresponding to the sensor area SA is defined through the cover pad 175. By providing or forming the opening 175OP in the cover pad 175, the light transmittance of the sensor area SA may be improved.

Although not shown, the cover pad 175 may include a protective layer and a cushion layer.

The protective layer may protect the substrate 100 from an external impact on the bottom of the substrate 100. In one exemplary embodiment, for example, the protective layer may protect the substrate 100 from contamination, scratches and impacts that may occur in a process of the display device. The protective layer may include a component such as fine silica powder, a silicone-based antifoaming agent, an additive, an antistatic agent, a petroleum naphtha solvent, or diethylene glycol monoethyl ether acetate.

The cushion layer may be disposed on the lower surface of the protective layer. The cushion layer may have an adhesive layer at an surface thereof, and thus may be attached to the lower surface of the protective layer.

The cushion layer may include a buffer member capable of absorbing an external impact. The buffer member may include a material capable of absorbing an impact. In one exemplary embodiment, for example, the buffer member may include or be formed of a sponge formed by foaming an elastic polymer resin, a rubber solution, a urethane-based material or an acrylic material.

The cushion layer may further include a light blocking member which blocks light emitted onto the substrate 100 from leaking through the substrate 100 and/or a heat dissipation member capable of dissipating heat generated by the display device 1, in addition to the above-described buffer member. The heat dissipation member may include a metal such as copper (Cu), silver (Ag), a copper alloy, aluminum (Al) with excellent thermal conductivity, or a carbon-based material such as graphite and graphene. The above-described buffer member, light blocking member and heat dissipation member may be stacked one on another in a thickness direction.

Although not shown, a lower protection film may be further included between the substrate 100 and the cover pad 175 to support and protect the substrate. The lower protective film may be disposed to overlap the entire area of the sensor area SA, and the lower protective film may include PET or PI.

The area of the sensor area SA may be larger than the area where the component 20 is disposed. Accordingly, the area of the opening 175OP provided in the cover pad 175 may not coincide with the area of the sensor area SA. In one exemplary embodiment, for example, the area of the opening 175OP may be smaller than that of the sensor area SA.

In an exemplary embodiment, a plurality of components 20 may be disposed in the sensor area SA. The plurality of components 20 may have different functions from each other.

Although not shown, components such as an input sensing member for sensing a touch input, a polarizer and a retarder or an antireflection member including a color filter and a black matrix, and a transparent window may be further disposed on the display panel 10.

In an exemplary embodiment, as described above, the thin film encapsulation layer 300 is used as an encapsulation member for sealing the display element layer 200, but the disclosure is not limited thereto. In one exemplary embodiment, for example, a sealing substrate bonded to the substrate 100 by a sealant or frit may be used as a member for sealing the display element layer 200.

Figure 3:
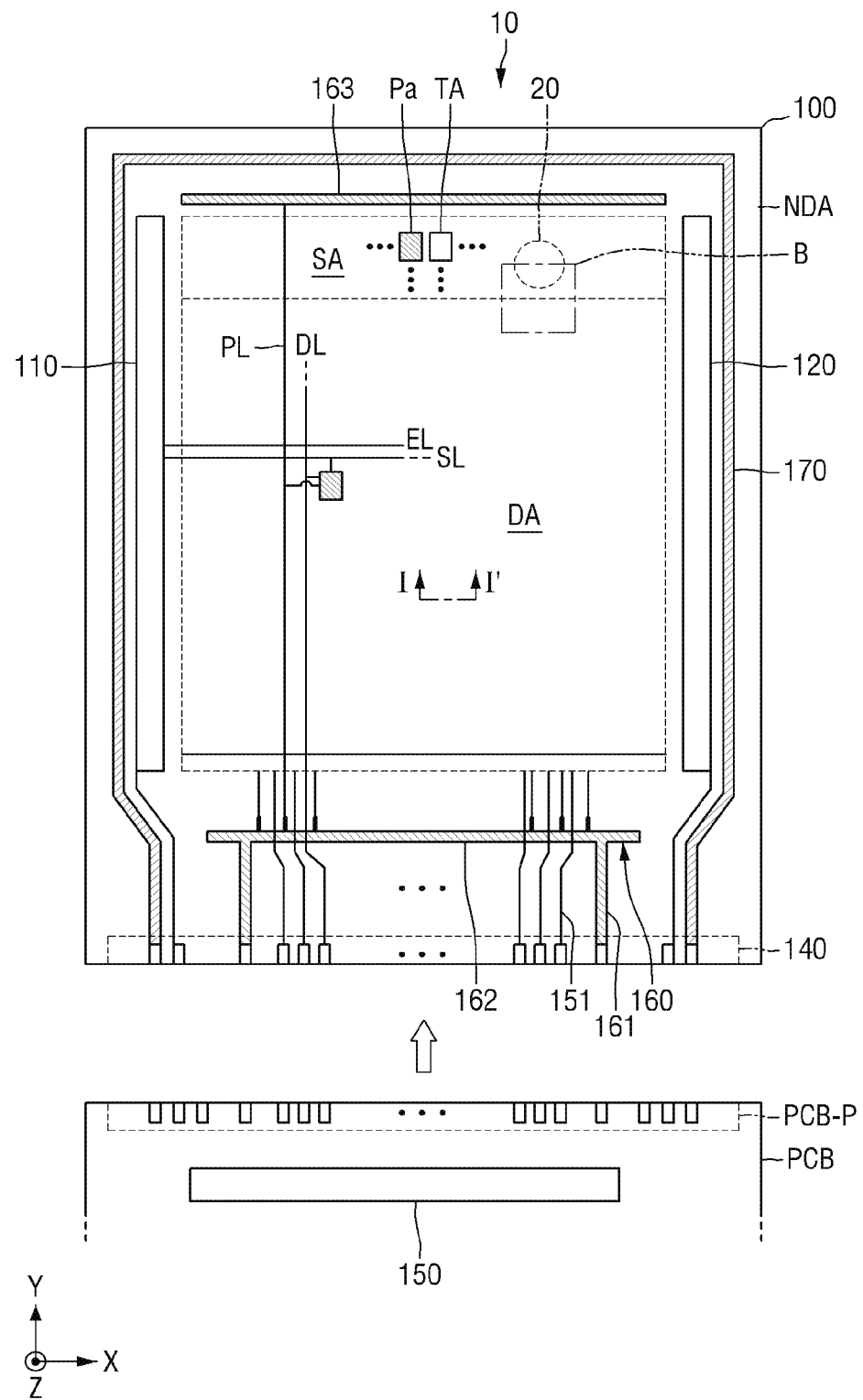
FIG. 3 is a plan view schematically illustrating a display panel according to an exemplary embodiment of the disclosure.

FIG. 3 is a plan view schematically illustrating a display panel according to an exemplary embodiment of the disclosure.

Referring to FIG. 3, in an exemplary embodiment, the display panel 10 is disposed in the display area DA and includes a plurality of first pixels Pm. Each of the first pixels Pm may include a display element such as an organic light emitting diode. Each first pixel Pm may emit, for example, red, green, blue or white light through the organic light emitting diode. Herein, the first pixel Pm may be understood as a subpixel which emits light of any one color of red, green, blue and white as described above. The display area DA may be covered with the encapsulation member described above with reference to FIG. 2 to protect the display area DA from external air or moisture.

The sensor area SA may be defined at a side portion of the display area DA, and a plurality of second pixels Pa may be disposed in the sensor area SA. Each of the second pixels Pa may include a display element such as an organic light emitting diode. Each second pixel Pa may emit, for example, red, green, blue or white light through the organic light emitting diode. Herein, the second pixel Pa may be understood as a subpixel which emits light of any one color of red, green, blue and white as described above. In an exemplary embodiment, the sensor area SA may be provided with the transmission portion TA disposed between the second pixels Pa. A component 20 may be disposed to correspond to the lower portion of the sensor area SA of the display panel 10.

In an exemplary embodiment, each first pixel Pm and each second pixel Pa may include a same pixel circuit as each other. However, the disclosure is not limited thereto. Alternatively, the pixel circuit included in the first pixel Pm and the pixel circuit included in the second pixel Pa may be different from each other.

Since the sensor area SA includes the transmission portion TA, the resolution of the sensor area SA may be less than that of the display area DA. In one exemplary embodiment, for example, the resolution of the sensor area SA may be about ½ of the display area DA.

Each of the pixels Pm and Pa may be electrically connected to outer circuits disposed in the non-display area. In the non-display area NDA, a first scan driving circuit 110, a second scan driving circuit 120, a terminal 140, a data driving circuit 150, a first power supply wiring 160 and a second power supply wiring 170 may be disposed.

The first scan driving circuit 110 may provide a scan signal to each of the pixels Pm and Pa through a scan line SL. The first scan driving circuit 110 may further provide an emission control signal to each pixel through an emission control line EL. The second scan driving circuit 120 may be disposed opposite to the first scan driving circuit 110 with the display area DA therebetween. Some of the pixels Pm and Pa disposed in the display area DA may be electrically connected to the first scan driving circuit 110, and the remaining pixels may be connected to the second scan driving circuit 120. In an alternative exemplary embodiment, the second scan driving circuit 120 may be omitted.

The terminal 140 may be disposed on a side portion of the substrate 100. The terminal 140 may be exposed without being covered by the insulating layer and electrically connected to a printed circuit board PCB. A terminal PCB-P of the printed circuit board PCB may be electrically connected to the terminal 140 of the display panel 10. The printed circuit board PCB transmits a signal or power of a controller (not shown) to the display panel 10. The control signal generated by the controller may be transmitted to each of the first and second scan driving circuits 110 and 120 through the printed circuit board PCB. The controller may provide first and second power supply voltages ELVDD and ELVSS (see FIGS. 4 and 5 to be described later) to the first and second power supply wirings 160 and 170, respectively, through first and second connection wirings 161 and 171. The first power supply voltage ELVDD may be provided to each pixel Pm, Pa through a driving voltage line PL connected to the first power supply wiring 160. The second power supply voltage ELVSS may be provided to a counter electrode of each pixel Pm, Pa connected to the second power supply wiring 170.

The data driving circuit 150 is electrically connected to a data line DL. A data signal of the data driving circuit 150 may be provided to each pixel Pm, Pa through a connection wiring 151 connected to the terminal 140 and the data line DL connected to the connection wiring 151. In an exemplary embodiment, as shown in FIG. 3, the data driving circuit 150 may be disposed on a printed circuit board PCB, but not being limited thereto. Alternatively, the data driving circuit 150 may be disposed on the substrate 100. In one exemplary embodiment, for example, the data driving circuit 150 may be disposed between the terminal 140 and the first power supply wiring 160.

The first power supply wiring 160 may include a first sub-wiring 162 and a second sub-wiring 163 extending in parallel along an x direction with the display area DA interposed therebetween. The second power supply wiring 170 may partially surround the display area DA in a loop shape, one side of which is open.

Figure 4:
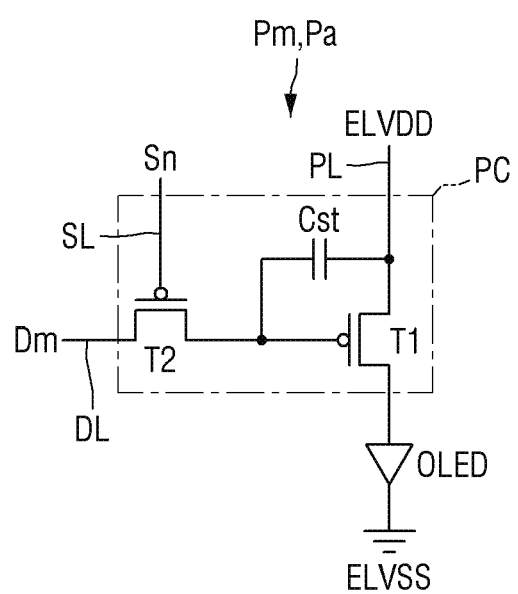
FIG. 4 is an equivalent circuit diagram of a pixel for performing active matrix driving, which may be disposed in a display area of a display device according to an exemplary embodiment of the disclosure.
Figure 5:
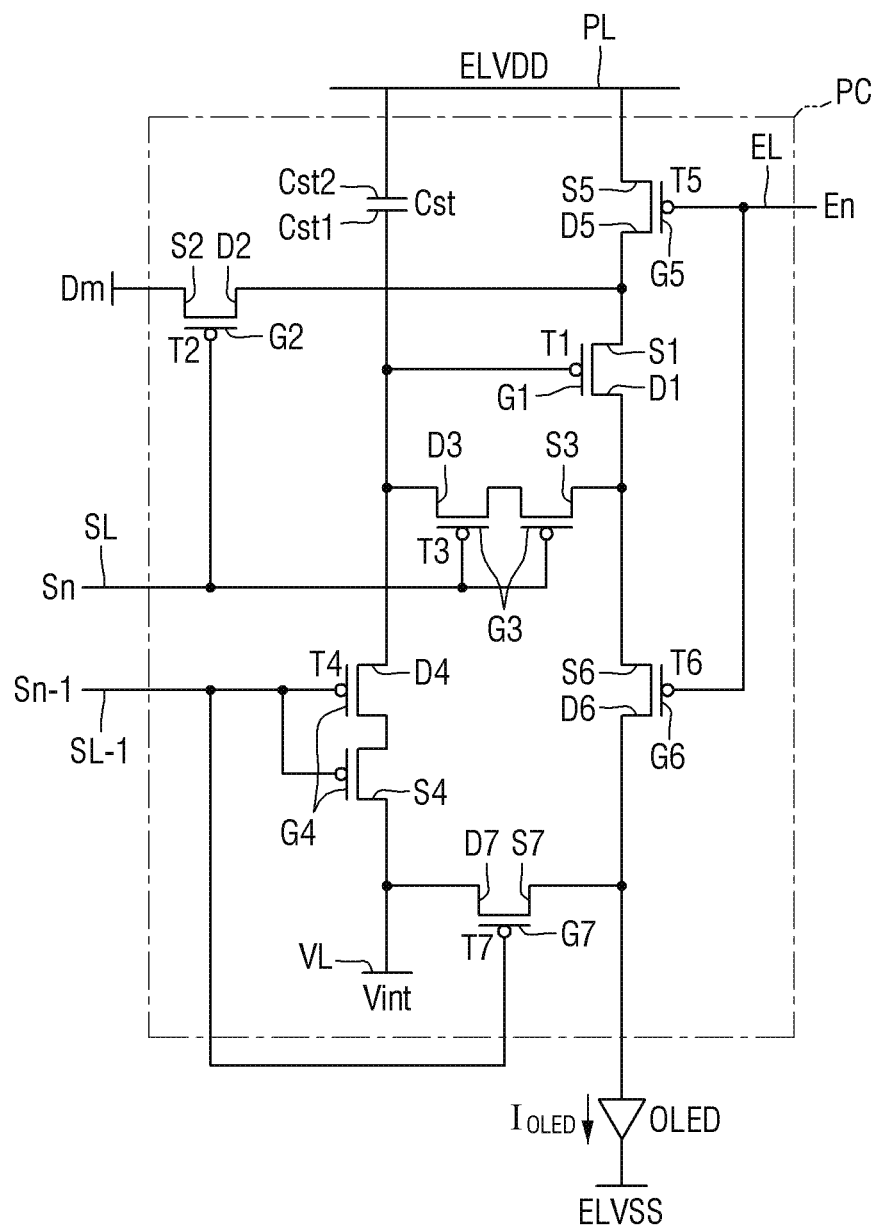
FIG. 5 is an equivalent circuit diagram of a pixel for performing active matrix driving, which may be disposed in a display area of a display device according to another exemplary embodiment of the disclosure.

FIGS. 4 and 5 are equivalent circuit diagrams of a first pixel and/or a second pixel in a display panel according to an exemplary embodiment of the disclosure.

Referring to FIG. 4, in an exemplary embodiment, each pixel Pm, Pa may include a pixel circuit PC connected to the scan line SL and the data line DL, and an organic light emitting diode OLED connected to the pixel circuit PC.

The pixel circuit PC includes a driving thin film transistor T1, a switching thin film transistor T2 and a storage capacitor Cst. The switching thin film transistor T2 is connected to the scan line SL and the data line DL. A data signal Dm inputted through the data line DL is transmitted to the driving thin film transistor T1 according to a scan signal Sn inputted through the scan line SL.

The storage capacitor Cst is connected to the switching thin film transistor T2 and the driving voltage line PL. The storage capacitor Cst stores a voltage corresponding to a difference between a voltage received from the switching thin film transistor T2 and the first power supply voltage ELVDD (or a driving voltage) supplied to the driving voltage line PL.

The driving thin film transistor T1 is connected to the driving voltage line PL and the storage capacitor Cst. The driving thin film transistor T1 may control a driving current flowing through the organic light emitting diode OLED from the driving voltage line PL in response to a voltage value stored in the storage capacitor Cst. The organic light emitting diode OLED may emit light having a predetermined luminance by the driving current.

In an exemplary embodiment, as shown in FIG. 4, the pixel circuit PC may include two thin film transistors and a single storage capacitor, but the disclosure is not limited thereto. Alternatively, as illustrated in FIG. 5, the pixel circuit PC may include seven thin film transistors and one storage capacitor.

Referring to FIG. 5, in an exemplary embodiment, each pixel Pm, Pa includes a pixel circuit PC and an organic light emitting diode OLED connected to the pixel circuit PC. The pixel circuit PC may include a plurality of thin film transistors and a storage capacitor. The thin film transistors and the storage capacitor may be connected to signal lines SL, SL-1, EL and DL, an initialization voltage line VL, and the driving voltage line PL.

In an exemplary embodiment, as shown in FIG. 5, each pixel Pm, Pa is connected to the signal lines SL, SL-1, EL and DL, the initialization voltage line VL and the driving voltage line PL, but the disclosure is not limited thereto. In an alternative exemplary embodiment, at least one of the signal lines SL, SL-1, EL and DL, the initialization voltage line VL, the driving voltage line PL and the like may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6 and a second initialization thin film transistor T7.

The signal lines may include a scan line SL which transmits a scan signal Sn, a previous scan line SL-1 which transmits a previous scan signal Sn-1 to the first initialization thin film transistor T4 and the second initialization thin film transistor T7, an emission control line EL which transmits an emission control signal En to the operation control thin film transistor T5 and the emission control thin film transistor T6, and a data line DL which intersects the scan line SL and transmits a data signal Dm. The driving voltage line PL transmits the driving voltage ELVDD to the driving thin film transistor T1, and the initialization voltage line VL transmits an initialization voltage Vint for initializing the driving thin film transistor T1 and a pixel electrode.

A driving gate electrode G1 of the driving thin film transistor T1 is connected to a first storage capacitive plate Cst1 of the storage capacitor Cst. A driving source electrode Si of the driving thin film transistor T1 is connected to a lower driving voltage line PL via the operation control thin film transistor T5. A driving drain electrode D1 of the driving thin film transistor T1 is electrically connected to a pixel electrode of a main organic light emitting diode OLED via the emission control thin film transistor T6. The driving thin film transistor T1 receives the data signal Dm in response to a switching operation of the switching thin film transistor T2 and supplies a driving current IOLED to the main organic light emitting diode OLED.

A switching gate electrode G2 of the switching thin film transistor T2 is connected to the scan line SL. A switching source electrode S2 of the switching thin film transistor T2 is connected to the data line DL. A switching drain electrode D2 of the switching thin film transistor T2 is connected to the driving source electrode S1 of the driving thin film transistor T1 and also connected to the lower driving voltage line PL via the operation control thin film transistor T5. The switching thin film transistor T2 is turned on in response to the scan signal Sn transmitted through the scan line SL to perform a switching operation of transmitting the data signal Dm transmitted to the data line DL to the driving source electrode S1 of the driving thin film transistor T1.

A compensation gate electrode G3 of the compensation thin film transistor T3 is connected to the scan line SL. A compensation source electrode S3 of the compensation thin film transistor T3 is connected to the driving drain electrode D1 of the driving thin film transistor T1, and also connected to the pixel electrode of the organic light emitting device OLED via the emission control thin film transistor T6. A compensation drain electrode D3 of the compensation thin film transistor T3 is connected to the first storage capacitive plate Cst1 of the storage capacitor Cst, a first initialization drain electrode D4 of the first initialization thin film transistor T4 and the driving gate electrode G1 of the driving thin film transistor T1. The compensation thin film transistor T3 is turned on in response to the scan signal Sn transmitted through the scan line SL to electrically connect the driving gate electrode G1 and the driving drain electrode D1 of the driving thin film transistor T1 to diode-connect the driving thin film transistor T1.

A first initialization gate electrode G4 of the first initialization thin film transistor T4 is connected to the previous scan line SL-1. A first initialization source electrode S4 of the first initialization thin film transistor T4 is connected to and the initialization voltage line VL and a second initialization drain electrode D7 of the second initialization thin film transistor T7. The first initialization drain electrode D4 of the first initialization thin film transistor T4 is connected to the first storage capacitive plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to the previous scan signal Sn-1 transmitted through the previous scan line SL-1 to perform an initialization operation of initializing the voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 is connected to the emission control line EL. An operation control source electrode S5 of the operation control thin film transistor T5 is connected to the lower driving voltage line PL. An operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL. An emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is electrically connected to the second initialization source electrode S7 of the second initialization thin film transistor T7 and the pixel electrode of the organic light emitting diode OLED.

The operation control thin film transistor T5 and the emission control thin film transistor T6 are simultaneously turned on in response to the emission control signal En transmitted through the emission control line EL such that the driving voltage ELVDD is transmitted to the main organic light emitting diode OLED to allow the driving current IOLED to flow through the organic light emitting diode OLED.

A second initialization gate electrode G7 of the second initialization thin film transistor T7 is connected to the previous scan line SL-1. A second initialization source electrode S7 of the second initialization thin film transistor T7 is connected to the emission control drain electrode D6 of the emission control thin film transistor T6 and the pixel electrode of the main organic light emitting diode OLED. A second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to the previous scan signal Sn-1 transmitted through the previous scan line SL-1 to initialize the pixel electrode of the main organic light emitting diode OLED.

Although FIG. 5 illustrates an embodiment where the first initialization thin film transistor T4 and the second initialization thin film transistor T7 are connected to the previous scan line SL-1, the disclosure is not limited thereto. In an alternative exemplary embodiment, the first initialization thin film transistor T4 may be connected to the previous scan line SL-1 and driven based on the previous scan signal Sn-1, and the second initialization thin film transistor T7 may be connected to a separate signal line (e.g., a subsequent scan line) and driven based on a signal transmitted to the signal line.

A second storage capacitive plate Cst2 of the storage capacitor Cst is connected to the driving voltage line PL, and a counter electrode of the organic light emitting diode OLED is connected to a common voltage ELVSS. Accordingly, the organic light emitting diode OLED receives the driving current IOLED from the driving thin film transistor T1 and emits light, thereby displaying an image.

Although FIG. 5 illustrates an exemplary embodiment where the compensation thin film transistor T3 and the first initialization thin film transistor T4 have dual gate electrodes, but not being limited thereto. Alternatively, the compensation thin film transistor T3 and the first initialization thin film transistor T4 may have one gate electrode.

In an exemplary embodiment, the first pixel Pm and the second pixel Pa may have a same pixel circuit PC as each other. However, the disclosure is not limited thereto. The first pixel Pm and the second pixel Pa may include pixel circuits PC having different structures from each other. In one exemplary embodiment, for example, the first pixel Pm may employ the pixel circuit of FIG. 5, and the second pixel Pa may employ the pixel circuit of FIG. 4, or various modifications may be made.

Figure 6:
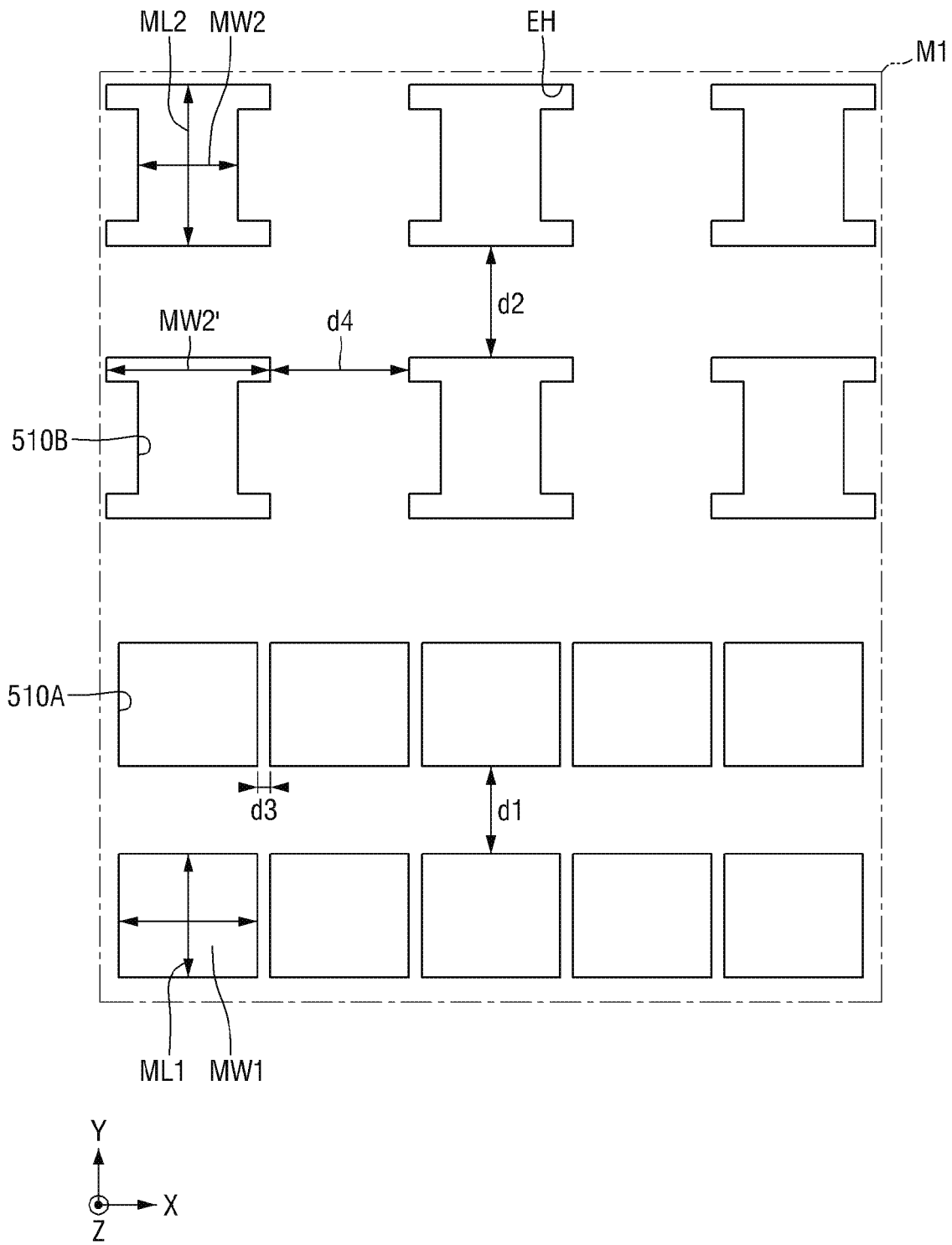
FIG. 6 shows an example of a mask for forming a counter electrode according to exemplary embodiments of the disclosure.

FIG. 6 shows a mask for forming a counter electrode according to exemplary embodiments of the disclosure.

Referring to FIG. 6, in an exemplary embodiment, a first mask opening 510A and a second mask opening 510B having different shapes from each other are defined or formed through a mask M1 for forming a counter electrode.

The first mask opening 510A may be formed in a rectangular shape having a first mask width MW1 in a first direction (x direction) and a first mask length ML1 in a second direction (y direction).

The second mask opening 510B may include a rectangular opening having a second mask width MW2 in the first direction (x direction) and a second mask length ML2 in the second direction (y direction) and may further include expansion holes EH extending in the first direction (x direction) from the vertices of the opening.

The expansion hole EH may have a rectangular shape. The second mask width MW2 may mean a width in the first direction (x direction) passing through the center of the second mask opening 510B. In such an embodiment, the first mask width MW1 may be larger than the second mask width MW2.

The first mask openings 510A and the second mask openings 510B may be sequentially arranged along the second direction (y direction). In FIG. 6, for simplicity of illustration and description, it is illustrated that the first mask openings 510A and the second mask openings 510B are alternatively arranged every two rows. In an alternative exemplary embodiment, the first mask openings 510A and the second mask openings 510B may be further disposed along the second direction (y direction) at predetermined intervals. In such an embodiment, a distance d1 between the first mask openings 510A adjacent in the second direction (y direction) may be greater than the first mask length ML1, and a distance d2 between the second mask openings 510B adjacent in the second direction (y direction) may be less than the first mask length ML1.

In an exemplary embodiment, the first mask openings 510A or the second mask openings 510B may be arranged in a line at predetermined intervals along the first direction (x direction). In such an embodiment, as shown in FIG. 6, a distance d3 between the first mask openings 510A adjacent in the first direction (x direction) may be less than the first mask width MW1, and a distance d4 between the expansion holes EH of the second mask openings 510B adjacent in the first direction (x direction) may be less than a width MW2' between the expansion hole EH disposed at an end of the second mask opening 510B and the expansion hole EH disposed at an opposing end thereof.

In an exemplary embodiment, the mask M1 may be a mask used to deposit counter electrodes 223 (see FIG. 11) and may be a fine metal mask ("FMM"). The FMM may be manufactured by forming holes in a metal plate and then tensioning the metal plate. Accordingly, the first and second mask openings 510A and 510B may be symmetrically formed with respect to an axis in the first direction passing through the center of the mask opening or an axis in the second direction passing through the center of the mask opening.

The first mask opening 510A for forming a first counter electrode 223A may have a size smaller than or equal to that of the first counter electrode 223A. The second mask opening 510B for forming a second counter electrode 223B may have a size smaller than or equal to that of the second counter electrode 223B.

Figure 7:
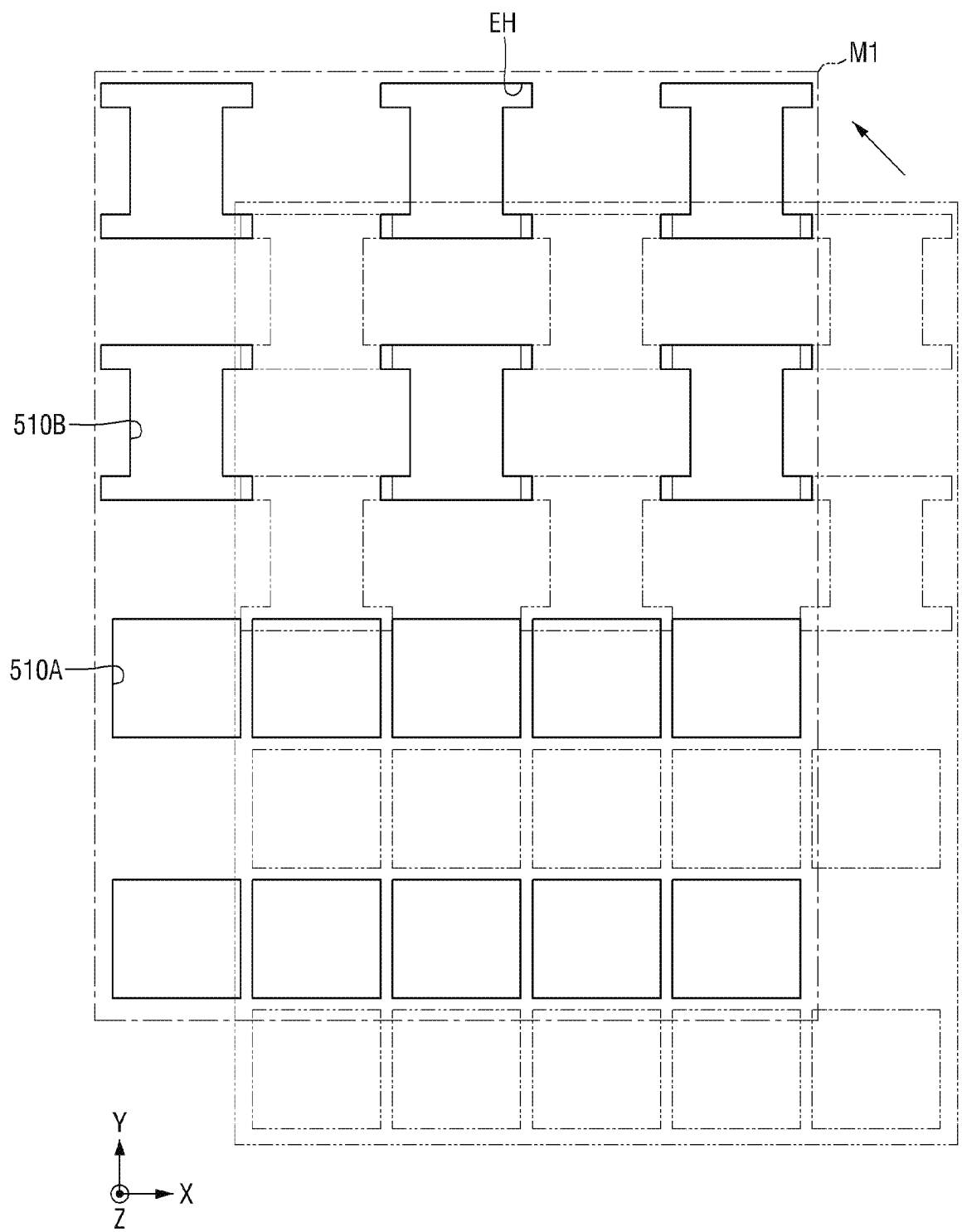
FIG. 7 illustrates a method of depositing counter electrodes 223 using a mask Ml.

In an exemplary embodiment, the deposition may be performed using a single mask M1 to form the counter electrodes 223. FIG. 7 illustrates an exemplary embodiment of a method of depositing the counter electrodes 223 using the mask M1.

Figure 11:
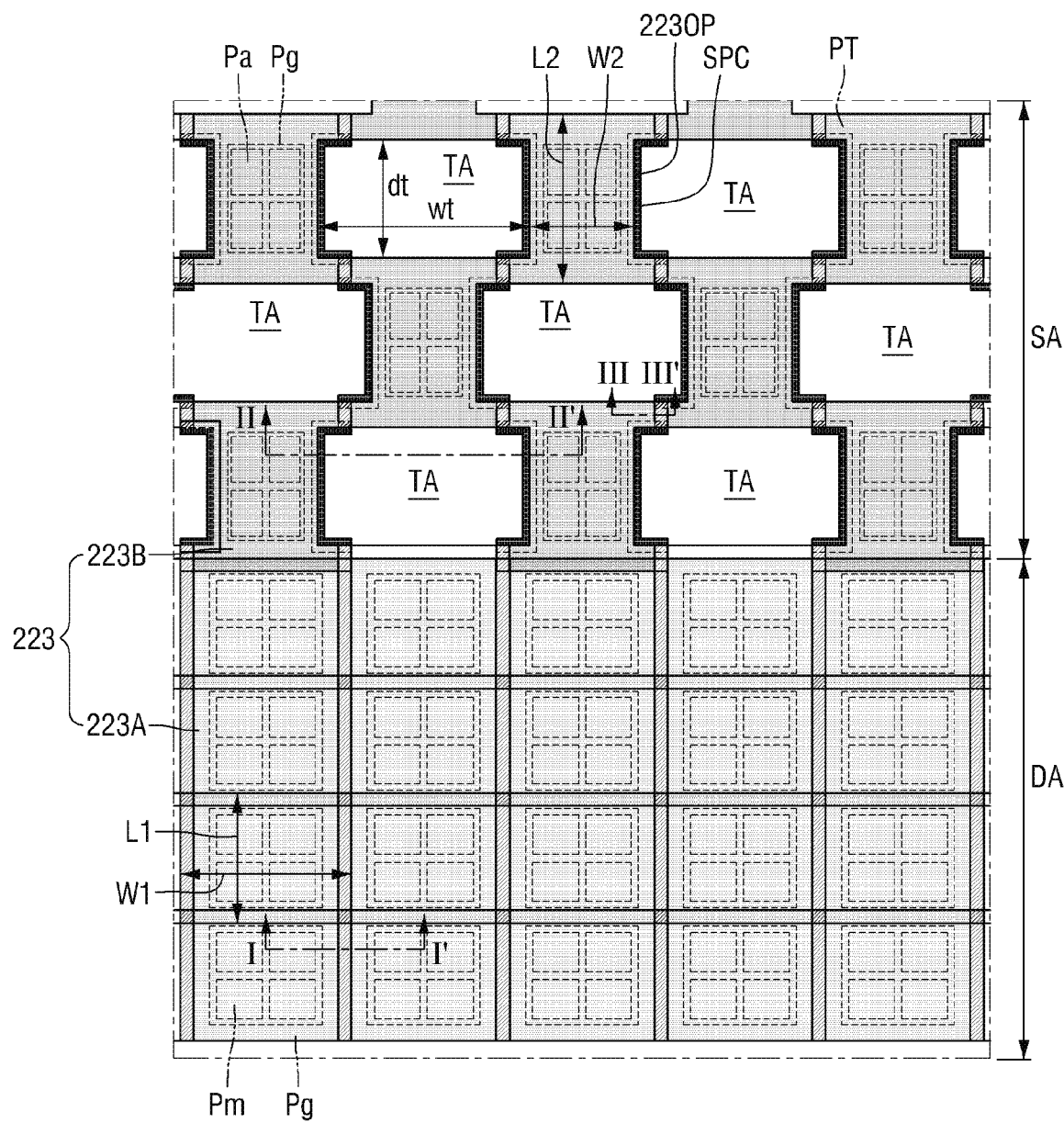
FIG. 11 is a schematic plan view corresponding to region B of FIG. 3 and illustrates a portion of a boundary between a display area and a sensor area.
Figure 13:
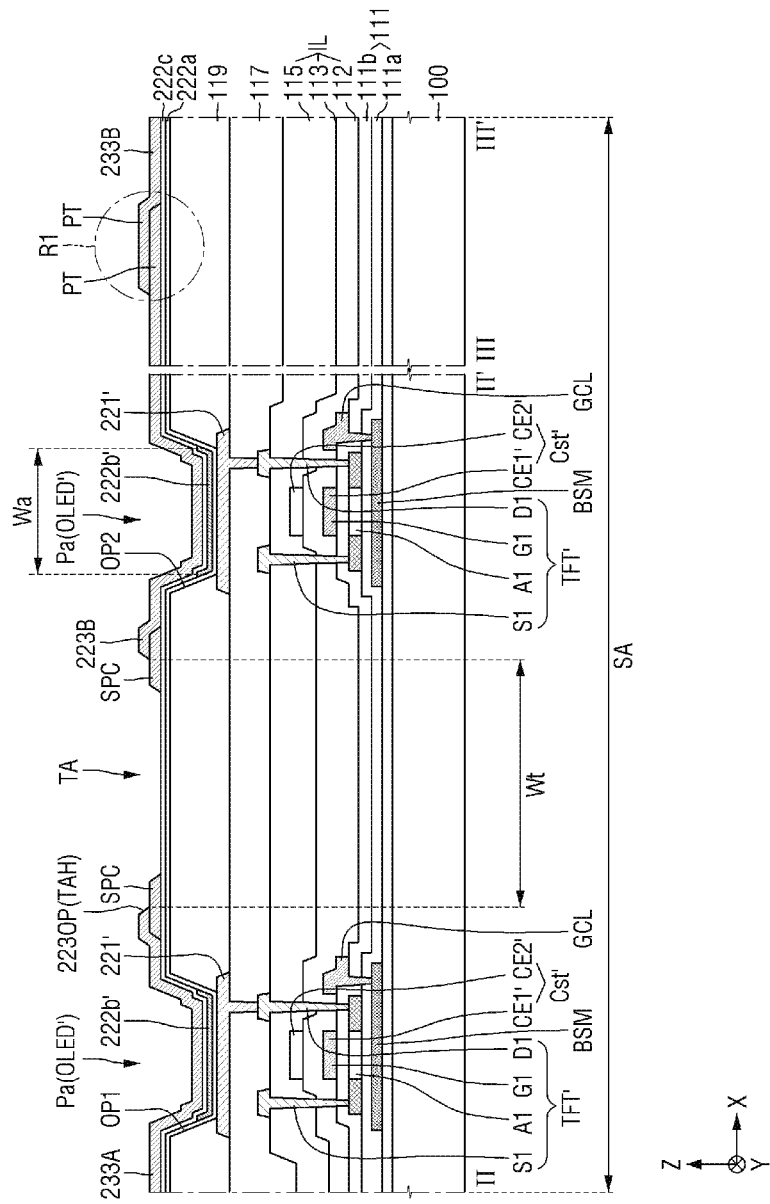
FIG. 13 is a schematic cross-sectional view taken along lines II-II' and III-III' of FIG. 11.

Referring to FIGS. 7, 11 and 13, after a second functional layer 222c is provided or formed on the substrate 100, the first and second mask openings 510A and 510B may be disposed to correspond to some pixel groups Pg.

Then, a deposition material to be formed as the counter electrode is discharged by using a deposition source (not shown) to primarily deposit some counter electrodes 223 on the second functional layer 222c. In such an embodiment, only a portion of the first and second counter electrodes 223A and 223B is formed to correspond to the arrangement of the first and second mask openings 510A and 510B of the mask M1.

Then, after moving the position of the mask M1 in the x and y directions, the remaining counter electrodes 223 are secondarily deposited. Some regions of the first and second counter electrodes 223A and 223B formed during the secondary deposition may overlap and contact the first and second counter electrodes 223A and 223B formed during the primary deposition.

As shown in FIG. 7, after the primary deposition of the counter electrodes 223, the mask M1 is moved leftward and upward in a direction of 45 degrees with respect to the first direction (x direction), and the secondary deposition is performed. However, the disclosure is not limited thereto.

In an exemplary embodiment, as described above, when the mask M1 is used, since the counter electrodes 223 are deposited twice using a single mask M1, the process time and process cost may be reduced compared to a process using two masks.

Figure 8:
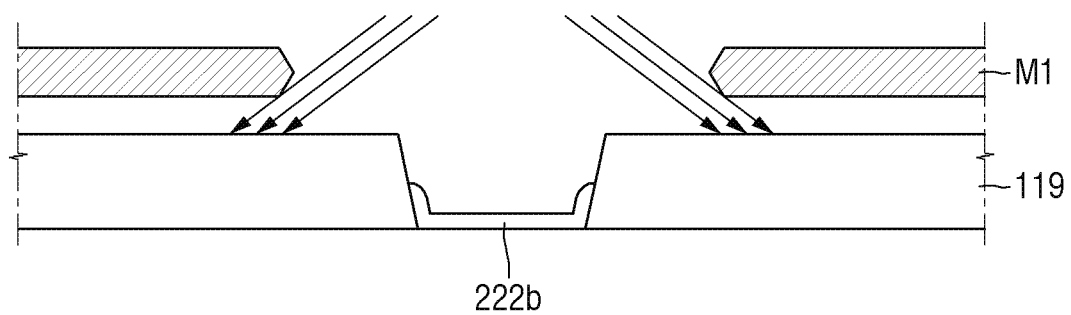
FIGS. 8 and 9 are schematic diagrams explaining a shadow phenomenon that may occur when the counter electrodes are deposited using a fine metal mask ("FMM")
Figure 9:
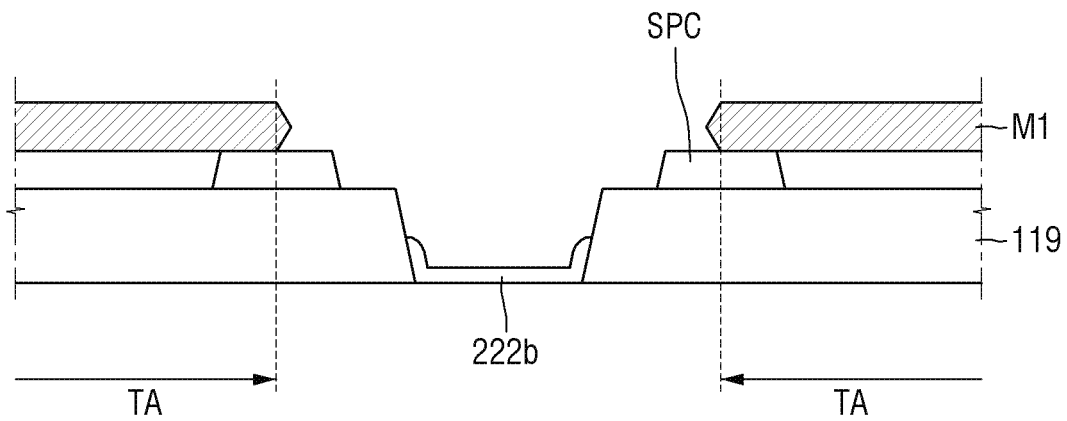

However, the process using a single mask may cause a process problem due to a so-called shadow phenomenon that hinders accurate patterning when depositing a deposition material. FIGS. 8 and 9 are schematic diagrams explaining a shadow phenomenon that may occur when the counter electrodes are deposited using the FMM.

Figure 12:
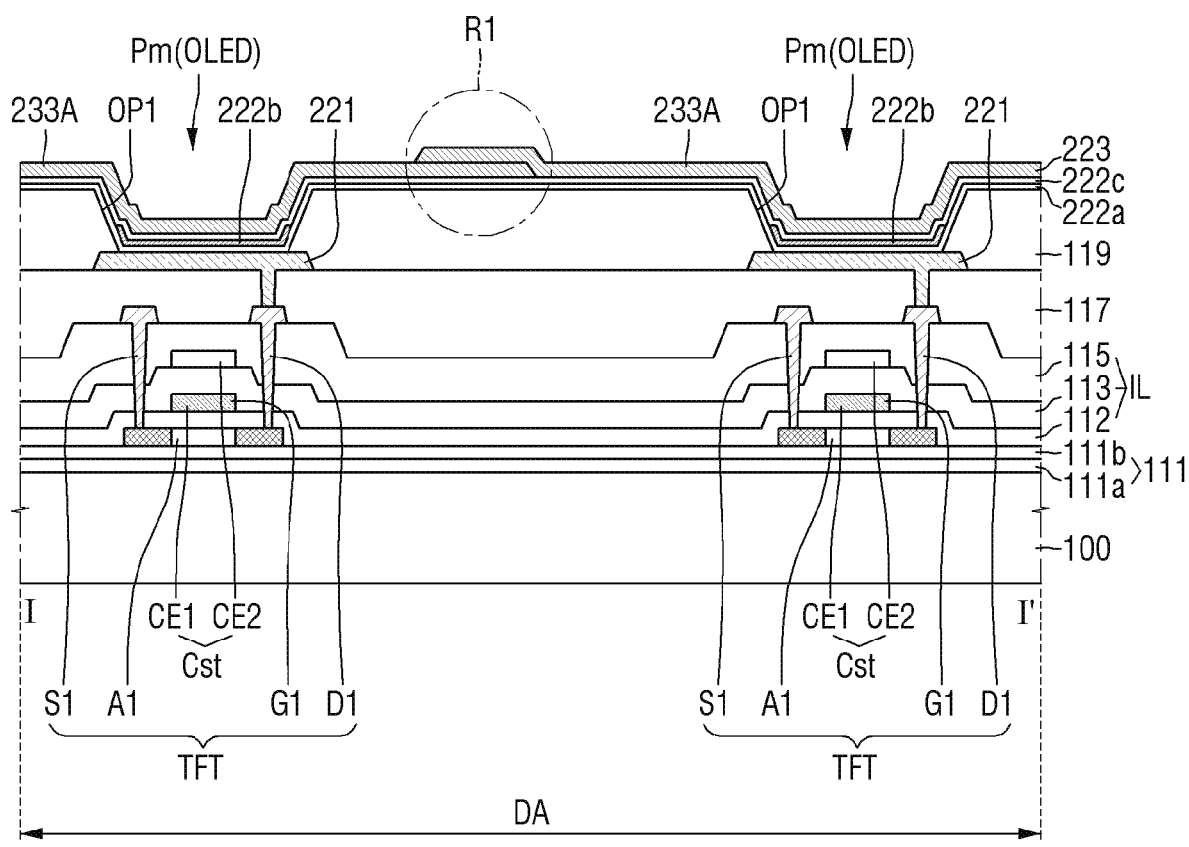
FIG. 12 is a schematic cross-sectional view taken along line I-I' of FIG. 11.

Referring to FIGS. 6, 8 and 12, in a state where a first light emitting layer 222b is formed on the openings of a pixel defining layer 119, the mask openings (e.g., 510A and 510B) may be disposed to correspond to some pixel groups Pg. Thereafter, when the deposition material to be formed as the counter electrodes is discharged, the deposition material may be deposited not only in the mask openings but also in the peripheral regions of the mask openings due to the shadow phenomenon (shadow effect).

As shown in FIG. 9, the peripheral region of the mask opening may be the transmission portion TA. A component such as a sensor using infrared light, visible light or sound may be disposed below the transmission portion TA. That is, since the light or/and sound outputted from the component to the outside or traveling toward the component from the outside may be transmitted through the transmission portion TA, it is desired to prevent the deposition of a deposition material including an opaque material to obtain high transmittance of the transmission portion TA. According to an exemplary embodiment, when the deposition material is deposited on the transmission portion TA, the transmittance may be reduced by about 30% or greater.

In an exemplary embodiment, a spacer SPC may be disposed around the opening of the mask M1 to prevent the shadow phenomenon. The spacer SPC may be formed to protrude in the thickness direction from the pixel defining layer 119. In such an embodiment, the height of the spacer SPC in the thickness direction may be equal to the distance from the upper surface of the pixel defining layer 119 to one surface of the mask M1. In an exemplary embodiment, although not shown in FIG. 9, a second functional layer 222c (see FIG. 12) may be disposed on the pixel defining layer 119. In such an embodiment, the height of the spacer SPC in the thickness direction may be equal to the distance from the upper surface of the second functional layer 222c to one surface of the mask M1.

The pixel defining layer 119 may include at least one organic material selected from benzocyclobutene ("BCB"), PI, polyamide ("PA"), acrylic resin and phenol resin.

In an exemplary embodiment, the pixel defining layer 119 and the spacer SPC may be integrally formed using a photosensitive material through a photolithography process. In such an embodiment, the pixel defining layer 119 and the spacer SPC may be made of a same material as each other. In such an embodiment, the pixel defining layer 119 and the spacer SPC may be formed together by adjusting the exposure amount through a semi-transmissive exposure process (using, e.g., a halftone mask or a slit mask). However, the disclosure is not limited thereto, and alternatively, the pixel defining layer 119 and the spacer SPC may be formed sequentially or separately. In such an embodiment, the pixel defining layer 119 and the spacer SPC may be made of different materials from each other.

When the spacer SPC is formed of a same material as the pixel defining layer 119, even if the spacer SPC is deposited on the transmission portion TA, the transmittance may be reduced by only about 2% to about 3%.

Figure 10:
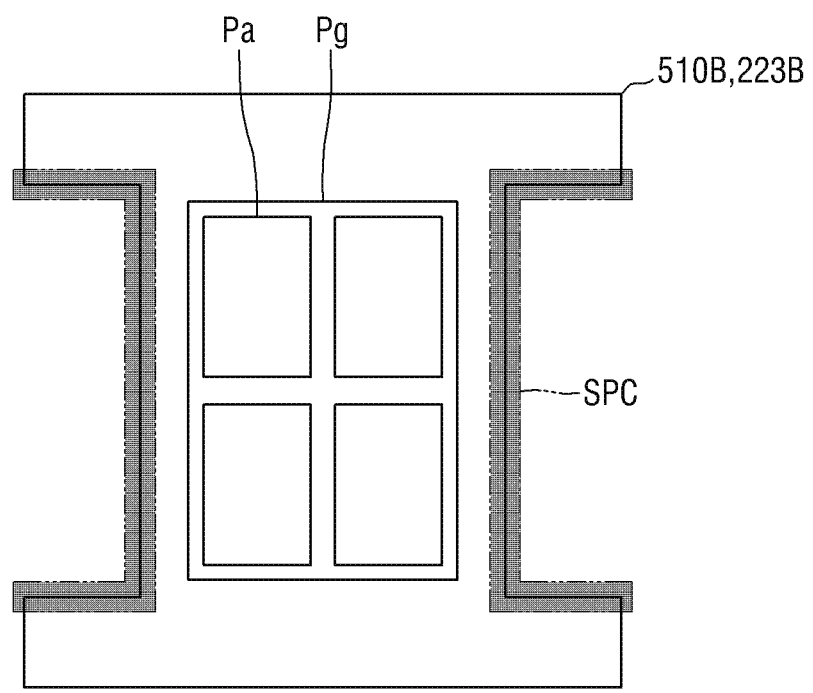
FIG. 10 is a diagram showing a planar arrangement of a second mask opening 510B of FIG. 6.

FIG. 10 is a diagram showing a planar arrangement of the second mask opening 510B of FIG. 6.

Referring to FIG. 10, the second mask opening 510B may entirely expose the pixel group Pg including the plurality of second pixels Pa. In such an embodiment, the second counter electrode 223B formed using the second mask opening MOB may be formed to entirely cover the pixel group Pg.

If the second counter electrode 223B is formed not to entirely cover the pixel group Pg, the emission state of the pixel group Pg may be unstable or poor. Thus, the second mask opening 510B may be designed to have a size larger than that of the pixel group Pg for a process margin. In an exemplary embodiment, it is desired to minimize the overlapping arrangement of the second counter electrode 223B and the transmission portion TA to improve the transmittance of the transmission portion TA. Therefore, the spacer SPC may be disposed in at least a portion of the edge of the second counter electrode 223B.

Hereinafter, an arrangement relationship between the transmission portions TA and the spacers SPC disposed in the sensor area will be described in detail with reference to FIGS. 11 to 13.

FIG. 11 is a schematic plan view corresponding to region B of FIG. 3 and illustrates a portion of a boundary between the display area and the sensor area. FIG. 12 is a schematic cross-sectional view taken along line I-I' of FIG. 11. FIG. 13 is a schematic cross-sectional view taken along lines II-II' and of FIG. 11.

In an exemplary embodiment, referring to FIG. 11, a display device includes a display area DA including a plurality of first pixels Pm, and a sensor area SA including a plurality of second pixels Pa and transmission portions TA, and the display device includes a plurality of counter electrodes 223. The counter electrodes 223 may include a plurality of first counter electrodes 223A disposed corresponding to the display area DA, and a plurality of second counter electrodes 223B disposed corresponding to the sensor area SA. The shape of the plurality of first counter electrodes 223A is different from the shape of the plurality of second counter electrodes 223B. The counter electrodes 223 may be connected to each other, and the thickness of the counter electrode 223 at the connection portion may be relatively larger.

Each of the first and second counter electrodes 223A and 223B may be disposed corresponding to one pixel group Pg.

The pixel group Pg may include at least one pixel Pa or Pm. FIG. 11 illustrates an exemplary embodiment where one pixel group Pg includes four pixels Pa, Pm arranged in two rows. However, the disclosure is not limited thereto. In such an embodiment, the number and arrangement of pixels Pa, Pm included in one pixel group Pg may be variously modified. In one exemplary embodiment, for example, one pixel group Pg may include three pixels Pa, Pm arranged side by side in one row, or eight pixels Pa, Pm arranged in four rows. Herein, the pixel Pa, Pm may mean a subpixel that emits red, green or blue light.

The transmission portion TA is a region having high light transmittance because no display element is disposed and may be provided in plural in the sensor area SA. The transmission portions TA may be disposed alternately with the pixel groups Pg along the first direction x and/or the second direction y. Alternatively, the transmission portions TA may be disposed to surround the pixel group Pg. Alternatively, the second pixels Pa may be disposed to surround the transmission portion TA. In an exemplary embodiment, the transmission portion TA is a region where the first and second counter electrodes 223A and 223B are not disposed, and may refer to a region corresponding to an opening 2230P of the counter electrode 223 in the sensor area SA.

The size of the transmission portion TA may be larger than that of an emission region of at least one pixel Pa, Pm. In an exemplary embodiment, the size of the transmission portion TA may be larger than or equal to the size of one pixel group Pg.

The first and second counter electrodes 223A and 223B may be electrically connected to each other.

Among the first counter electrodes 223A, the first counter electrodes 223A adjacent to each other in the first direction (x direction) and the second direction (y direction) may overlap and contact each other at edges thereof. Referring to FIG. 6, the first mask openings 510A are spaced apart from each other by the predetermined distance d3 in the first direction (x direction) and spaced apart from each other by the predetermined distance d1 in the second direction (y direction). However, when the deposition material is deposited, the deposition material may be disposed to overlap each other due to a shadow phenomenon or the like. Accordingly, the first counter electrodes 223A may be in contact with each other in the first direction (x direction) and the second direction (y direction), and may be electrically connected to the second power supply wiring 170 (see FIG. 3) of the non-display area NDA.

The second counter electrodes 223B are disposed to surround the transmission portion TA. Among the second counter electrodes 223B surrounding the transmission portion TA, the second counter electrodes 223B disposed adjacent to each other along the edge of the transmission portion TA may be configured in a way such that protrusions PT protruding from the vertices in the first direction (x direction) overlap and contact each other. The second counter electrodes 223B connected to each other may be electrically connected to the second power supply wiring 170 (see FIG. 3) of the non-display area NDA.

In an exemplary embodiment, it may be understood that the second counter electrodes 223B arranged along the first direction x are spaced apart from each other with the transmission portion TA interposed therebetween, and the second counter electrodes 223B arranged along the second direction y are spaced apart from each other with the transmission portion TA interposed therebetween. In such an embodiment, it may be understood that the second counter electrodes 223B disposed adjacent to each other in the second direction (y direction) overlap and contact each other at the protrusions PT.

In an exemplary embodiment, a first width W1 of the first counter electrode 223A disposed in the display area DA in the first direction (x direction) may be greater than a second width W2 of the second counter electrode 223B disposed in the sensor area SA in the first direction (x direction). In such an embodiment, since the second width W2 is smaller than the first width W1, a separation distance between the second counter electrodes 223B disposed with the transmission portion TA interposed therebetween may be large. That is, a width Wt of the transmission portion TA in the first direction (x direction) is greater than the first width W1. Accordingly, the area of the transmission portion TA through which light may be transmitted may be large, and the following inequality: Wt>W1>W2 may be satisfied. In an exemplary embodiment, a first length L1 of the first counter electrode 223A disposed in the display area DA in the second direction (y direction) may be less than a second length L2 of the second counter electrode 223B disposed in the sensor area SA in the second direction (y direction).

In an exemplary embodiment, among the first counter electrodes 223A, a distance between the first counter electrodes 223A adjacent to each other in the second direction (y direction) may be substantially small compared to a length dt of the transmission portion TA in the second direction (y direction).

For simplicity of illustration and description, FIG. 11 illustrates an exemplary embodiment where the first pixel Pm and the second pixel Pa have different sizes or shapes from each other, but the disclosure is not limited thereto. Alternatively, the first pixel Pm and the second pixel Pa may have a same size as each other. The spacer SPC may be disposed to overlap at least a portion of a boundary region between the transmission portion TA and the second counter electrodes 223B.

The spacer SPC has a predetermined width, and may be disposed to at least partially overlap a boundary region between the transmission portion TA and the protrusions PT in the first direction (x direction) and a boundary region between the transmission portion TA and the second counter electrodes 223B in the second direction (y direction).

Hereinafter, a stacked structure of a display device according to an exemplary embodiment of the disclosure will be described with reference to FIGS. 12 and 13. FIG. 12 is a schematic cross-sectional view taken along line I-I' of FIG. 11, showing a partial cross section of the display area DA. FIG. 13 is a schematic cross-sectional view taken along lines II-II' and III-III' of FIG. 11, showing a partial cross section of the sensor area SA.

Referring to FIGS. 12 and 13, an exemplary embodiment of a display device includes the display area DA and the sensor area SA. The first pixels Pm are disposed in the display area DA, and the second pixels Pa and the transmission portions TA are disposed in the sensor area SA.

In such an embodiment, as shown in FIG. 12, the first pixel Pm may include a main thin film transistor TFT, a main storage capacitor Cst and a main organic light emitting diode OLED. In such an embodiment, as shown in FIG. 13, the second pixel Pa may include an auxiliary thin film transistor TFT', an auxiliary storage capacitor Cst' and an auxiliary organic light emitting diode OLED'. The transmission portion TA may include a transmission hole TAH defined in the counter electrode 223A to correspond to the transmission portion TA.

Hereinafter, a structure in which components included in an exemplary embodiment of a display device are stacked will be described.

The substrate 100 may include a glass or a polymer resin. In one exemplary embodiment, for example, the polymer resin may include PES, PA, PEI, PEN, PET, PPS, PAR, PI, PC, CAP, or the like. The substrate 100 including the polymer resin may have flexible, rollable, or bendable characteristics. The substrate 100 may have a multilayer structure including a layer including the above-described polymer resin and an inorganic layer (not shown).

A buffer layer 111 may be located on the substrate 100 to reduce or prevent infiltration of foreign matter, moisture or external air from the lower portion of the substrate 100, and may provide a flat surface on the substrate 100. The buffer layer 111 may include an inorganic material such as an oxide or a nitride, an organic material, or an inorganic-organic composite material, and may have a single layer or multilayer structure of an inorganic material and an organic material. A barrier layer (not shown) may be further included between the substrate 100 and the buffer layer 111 to prevent infiltration of external air. In an exemplary embodiment, the buffer layer 111 may include be formed of silicon oxide ($SiO_2$) or silicon nitride (SiNX). The buffer layer 111 may have a structure in which a first buffer layer 111a and a second buffer layer 111b are stacked.

In the sensor area SA, a lower electrode layer BSM may be disposed between the first buffer layer 111a and the second buffer layer 111b. In an alternative exemplary embodiment, the lower electrode layer BSM may be disposed between the substrate 100 and the first buffer layer 111a. The lower electrode layer BSM may be disposed below the auxiliary thin film transistor TFT' to prevent the characteristics of the auxiliary thin film transistor TFT' from being deteriorated by the light emitted from the component 20 or the like.

In an exemplary embodiment, the lower electrode layer BSM may be connected to a wiring GCL disposed on another layer through a contact hole. The lower electrode layer BSM may receive a constant voltage or signal from the wiring GCL. In one exemplary embodiment, for example, the lower electrode layer BSM may receive a driving voltage ELVDD or a scan signal. In an exemplary embodiment, the lower electrode layer BSM receives a constant voltage or signal, such that the probability of generating electrostatic discharge may be significantly reduced. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The lower electrode layer BSM may be a single layer or a multilayer of the above-mentioned materials.

A main thin film transistor TFT and an auxiliary thin film transistor TFT' may be disposed on the buffer layer 111. The main thin film transistor TFT includes a first semiconductor layer A1, a first gate electrode G1, a first source electrode S1 and a first drain electrode D1. The auxiliary thin film transistor TFT' includes a second semiconductor layer A2, a second gate electrode G2, a second source electrode S2 and a second drain electrode D2. The main thin film transistor TFT may be connected to the main organic light emitting diode OLED of the display area DA to drive the main organic light emitting diode OLED. The auxiliary thin film transistor TFT' may be connected to the auxiliary organic light emitting diode OLED' of the sensor area SA to drive the auxiliary organic light emitting diode OLED'.

The first semiconductor layer A1 and the second semiconductor layer A2 are disposed on the buffer layer 111 and may include polysilicon. In an alternative exemplary embodiment, the first semiconductor layer A1 and the second semiconductor layer A2 may include amorphous silicon. In another alternative exemplary embodiment, the first semiconductor layer A1 and the second semiconductor layer A2 may include an oxide of at least one material selected from indium (In), gallium (Ga), stanium (Sn), zirconium (Zr), vanadium (V), hafnium (Hf), cadmium (Cd), germanium (Ge), chromium (Cr), titanium (Ti) and zinc (Zn). The first semiconductor layer A1 and the second semiconductor layer A2 may include a channel region and a source region and a drain region doped with impurities.

The second semiconductor layer A2 may overlap the lower electrode layer BSM with the second buffer layer 111b interposed therebetween. In an exemplary embodiment, the width of the second semiconductor layer A2 may be smaller than the width of the lower electrode layer BSM. Thus, when viewed from a plan view in a thickness direction of the substrate 100, the second semiconductor layer A2 may overlap the lower electrode layer BSM as a whole.

A first gate insulating layer 112 may be disposed to cover the first semiconductor layer Al and the second semiconductor layer A2. The first gate insulating layer 112 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$). The first gate insulating layer 112 may be a single layer or a multilayer including the above-mentioned inorganic insulating material.

The first gate electrode G1 and the second gate electrode G2 are disposed on the first gate insulating layer 112 to overlap the first semiconductor layer A1 and the second semiconductor layer A2, respectively. The first gate electrode G1 and the second gate electrode G2 may be as a single layer or multiple layers including molybdenum (Mo), aluminum (Al), copper (Cu), titanium (Ti) or the like. In one exemplary embodiment, for example, the first gate electrode G1 and the second gate electrode G2 may be a single layer of Mo.

A second gate insulating layer 113 may be provided to cover the first gate electrode G1 and the second gate electrode G2. The second gate insulating layer 113 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$). The second gate insulating layer 113 may be a single layer or a multilayer including the above-mentioned inorganic insulating material.

A first upper electrode CE2 of the main storage capacitor Cst and a second upper electrode CE2' of the auxiliary storage capacitor Cst' may be disposed on the second gate insulating layer 113.

In the display area DA, the first upper electrode CE2 may overlap the first gate electrode G1 therebelow. The first gate electrode G1 and the first upper electrode CE2 overlapping each other with the second gate insulating layer 113 interposed therebetween may constitute the main storage capacitor Cst. That is, the first gate electrode G1 may function as a first lower electrode CE1 of the main storage capacitor Cst.

In the sensor area SA, the second upper electrode CE2' may overlap the second gate electrode G2 therebelow. The second gate electrode G2 and the second upper electrode CE2' overlapping each other with the second gate insulating layer 113 interposed therebetween may constitute the auxiliary storage capacitor Cst'. The first gate electrode G1 may function as a second lower electrode CE1' of the auxiliary storage capacitor Cst'.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may be a single layer or a multilayer of the above-mentioned materials.

An interlayer insulating layer 115 may be disposed to cover the first upper electrode CE2 and the second upper electrode CE2'. The interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$) or the like.

The source electrodes S1 and S2 and the drain electrodes D1 and D2 may be disposed on the interlayer insulating layer 115. The source electrodes S1 and S2 and the drain electrodes D1 and D2 may include a conductive material including molybdenum (Mo), aluminum (Al), copper (Cu), titanium (Ti) or the like, and may be formed as a multilayer or a single layer including the above-mentioned material. In one exemplary embodiment, for example, the source electrodes S1 and S2 and the drain electrodes D1 and D2 may have a multilayer structure of Ti/Al/Ti.

A planarization layer 117 may be disposed to cover the source electrodes S1 and S2 and the drain electrodes D1 and D2. The planarization layer 117 may have a flat upper surface such that a first pixel electrode 221 and a second pixel electrode 221' disposed thereon may be formed flat.

The planarization layer 117 may be formed as a single layer or multiple layers made of an organic material or an inorganic material. In an exemplary embodiment, the planarization layer 117 may include a general-purpose polymer such as BCB, PI, hexamethyldisiloxane ("HMDSO"), polymethylmethacrylate ("PMMA") or polystyrene ("PS"), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or a blend thereof. In an exemplary embodiment, the planarization layer 117 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$) or the like. After the planarization layer 117 is formed, chemical mechanical polishing may be performed to provide a flat upper surface.

An opening is defined through the planarization layer 117 to expose one of the first source electrode S1 and the first drain electrode D1 of the main thin film transistor TFT. The first pixel electrode 221 may be electrically connected to the main thin film transistor TFT by contacting the first source electrode S1 or the first drain electrode D1 through the opening.

In an exemplary embodiment, an opening is defined through the planarization layer 117 to expose any one of the second source electrode S2 and the second drain electrode D2 of the auxiliary thin film transistor TFT'. Thus, the second pixel electrode 221' may be electrically connected to the auxiliary thin film transistor TFT' by contacting the second source electrode S2 or the second drain electrode D2 through the opening.

In an exemplary embodiment, the first pixel electrode 221 and the second pixel electrode 221' may include a conductive oxide such as indium tin oxide ("ITO"), indium zinc oxide ("IZO"), zinc oxide (ZnO), indium oxide ($In_2O_3$), indium gallium oxide ("IGO") or aluminum zinc oxide ("AZO"). In an alternative exemplary embodiment, the first pixel electrode 221 and the second pixel electrode 221' may include a reflective film containing silver (Ag), magnesium (Mg), aluminum (Al), platinum (Pt), palladium (Pd), gold (Au), nickel (Ni), neodymium (Nd), iridium (Ir), chromium (Cr) or a combination thereof. In another alternative embodiment, the first pixel electrode 221 and the second pixel electrode 221' may further include a film formed of ITO, IZO, ZnO or $In_2O_3$ above/below the reflective film. In one exemplary embodiment, for example, the first pixel electrode 221 and the second pixel electrode 221' may have a stacked structure of ITO/Ag/ITO.

The pixel defining layer 119 may cover edges of each of the first pixel electrode 221 and the second pixel electrode 221'. In an exemplary embodiment, a first opening OP1 and a second opening OP2 are defined through the pixel defining layer 119 to overlap the first pixel electrode 221 and the second pixel electrode 221', respectively, thereby defining an emission region of the pixel. The pixel defining layer 119 may serve to prevent an arc or the like from occurring at the edges of the pixel electrodes 221 and 221' by increasing the distance between the edges of the pixel electrodes 221 and 221' and the counter electrodes 223 on the pixel electrodes 221 and 221'. The pixel defining layer 119 may include at least one organic material selected from BCB, PI, PA, acrylic resin and phenol resin.

A first functional layer 222a may be disposed on the pixel electrodes 221 and 221' exposed by the openings OP1 and OP2 of the pixel defining layer 119. The first functional layer 222a may be disposed to extend to the upper surface of the pixel defining layer 119. The first functional layer 222a may be a single layer or a multilayer. The first functional layer 222a may be a hole transport layer ("HTL") having a single layer structure. Alternatively, the first functional layer 222a may include a hole injection layer ("HIL") and the HTL. The first functional layer 222a may be integrally formed to correspond to the first pixels Pm and the second pixels Pa included in the display area DA and the sensor area SA.

A first light emitting layer 221b and a second light emitting layer 222b' are disposed on the first functional layer 222a to correspond to the first pixel electrode 221 and the second pixel electrode 221', respectively. The first light emitting layer 222b and the second light emitting layer 222b' may include a polymer material or a low molecular material, and may emit red, green, blue or white light.

The second functional layer 222c may be disposed on the first light emitting layer 222b and the second light emitting layer 222b'. The second functional layer 222c may be a single layer or a multilayer. The second functional layer 222c may include an electron transport layer ("ETL") and/or an electron injection layer ("EIL"). The second functional layer 222c may be integrally formed to correspond to the first pixels Pm and the second pixels Pa included in the display area DA and the sensor area SA. Alternatively, the first functional layer 222a and/or the second functional layer 222c may be omitted.

In an exemplary embodiment, the spacer SPC may be disposed on the second functional layer 222c. In an exemplary embodiment, the spacer SPC may include or be made of a same material as the pixel defining layer 119. In such an embodiment, the spacer SPC may include at least one organic material selected from BCB, PI, PA, acrylic resin and phenol resin.

According to an exemplary embodiment, the spacer SPC may be disposed between the transmission portion TA and the second opening OP2, and may be disposed to overlap at least a portion of the transmission portion TA. When the spacer SPC is formed of a same material as the pixel defining layer 119, even if the spacer SPC is deposited on the transmission portion TA, the transmittance may be reduced by only about 2% to about 3%.

The counter electrode 223 is disposed on a portion of the second functional layer 222c and the spacer SPC. The counter electrode 223 may include a conductive material having a low work function. In one exemplary embodiment, for example, the counter electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), an alloy thereof or the like. Alternatively, the counter electrode 223 may further include a layer such as ITO, IZO, ZnO or $In_2O_3$ on the (semi) transparent layer including the aforementioned material.

In an exemplary embodiment, as described above, the counter electrodes 223 include the first counter electrodes 223A disposed in the display area DA and the second counter electrodes 223B disposed in the sensor area SA.

Among the first counter electrodes 223A, the first counter electrodes 223A adjacent to each other may overlap and contact each other at edges thereof (region R1 of FIG. 12). The overlapping portion may be formed between the first pixels Pm. Among the second counter electrodes 223B, the second counter electrodes 223B adjacent to each other may overlap and contact each other at the protrusions PT (region R2 of FIG. 13). It may be understood that the thickness of the counter electrode 223 in the overlapping region is greater than the thickness of a central region of each of the first and second counter electrodes 223A and 223B.

In an exemplary embodiment, in the sensor area SA, some of the second counter electrodes 223B may be separated from each other with the transmission portion TA therebetween. According to an exemplary embodiment, at least a portion of the second counter electrode 223B may be disposed to overlap the spacer SPC, and may not be disposed on the transmission portion TA.

In such an embodiment, the separation space between the second counter electrodes 223B may be understood as the opening 2230P of the counter electrode 223, and the opening 2230P may be the transmission hole TAH through which light is transmitted. The width Wt of the transmission hole TAH may be larger than the width Wa of the emission region defined by the second opening OP2 of the pixel defining layer 119.

In such an embodiment, the light transmittance at the transmission portion TA may be substantially increased by the formation of the transmission hole TAH through the counter electrode 223 corresponding to the transmission portion TA.

Although not shown, a capping layer may be disposed on the counter electrode 223 to improve the light extraction efficiency while protecting the counter electrode 223. The capping layer may include LiF. Alternatively, the capping layer may include an inorganic insulating material such as silicon nitride, and/or may include an organic insulating material. Alternative, the capping layer may be omitted.

Hereinafter, alternative exemplary embodiments will be described. In the following embodiments, any repetitive detailed description of the same or like components as those of the above-described embodiment will be omitted or simplified, and differences will be mainly described.

Figure 14:
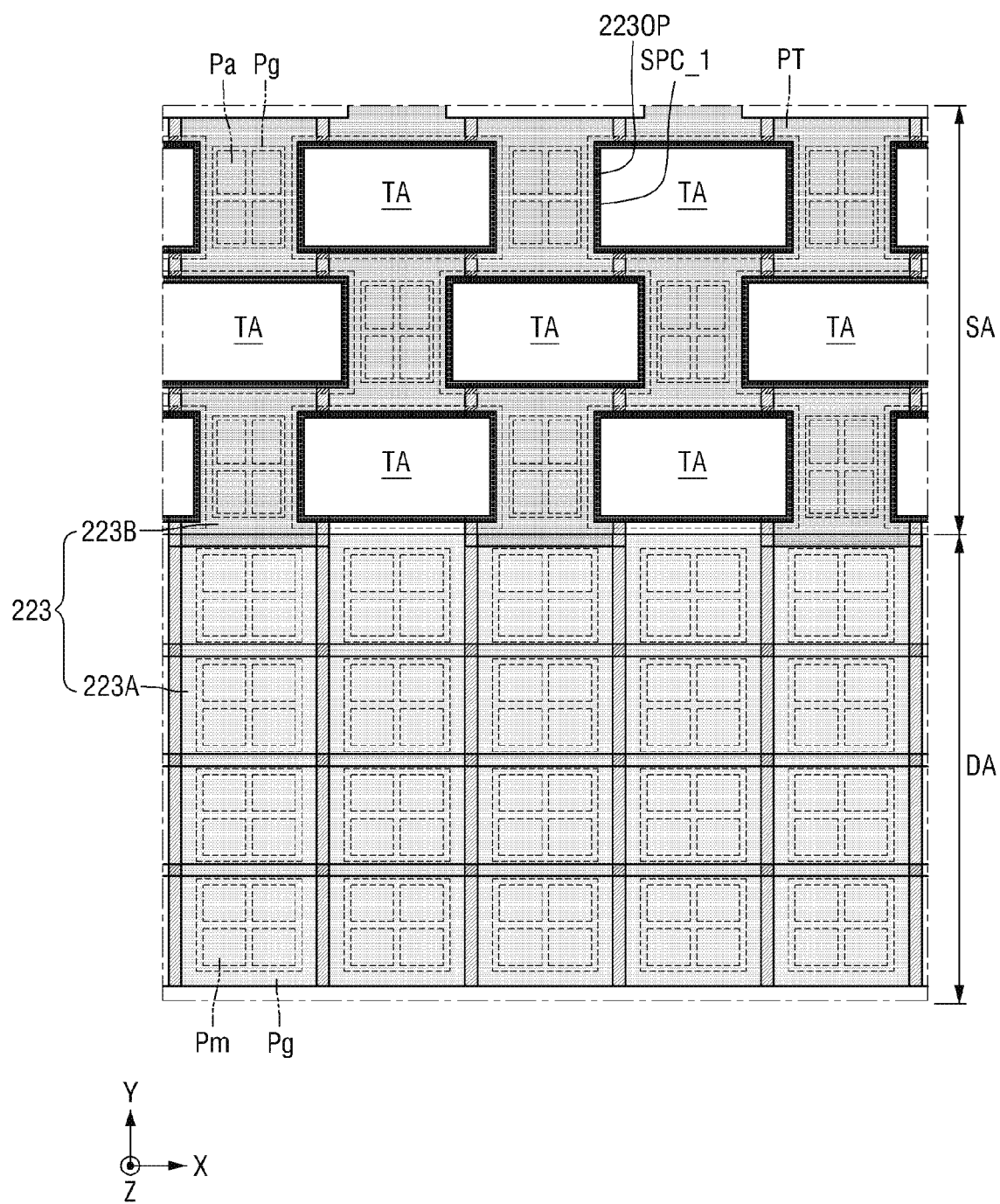
FIG. 14 is a schematic plan view corresponding to region B of FIG. 3 according to an alternative exemplary embodiment and illustrates a portion of a boundary between a display area and a sensor area.

FIG. 14 is a schematic plan view corresponding to region B of FIG. 3 according to an alternative exemplary embodiment and illustrates a portion of a boundary between a display area and a sensor area.

Referring to FIG. 14, in an exemplary embodiment, a spacer SPC_1 is disposed entirely along the boundary of the opening 223OP of the second counter electrode 223B, differently from the embodiment of FIG. 11 in which the spacer SPC is disposed only in a portion of the opening 2230P of the second counter electrode 223B.

In such an embodiment, each of the plurality of second counter electrodes 223B has a rectangular shape including protrusions PT protruding in the first direction (x direction) from four vertices. The transmission portion TA surrounded by the plurality of second counter electrodes 223B may also have a rectangular shape. In such an embodiment, the spacer SPC_1 may have a predetermined width and may be disposed entirely along the rectangular shape of the transmission portion TA.

Thus, when the deposition material is deposited using the mask M1, the possibility of depositing the deposition material on the transmission portion TA may be further reduced. In such an embodiment, the possibility that the second counter electrodes 223B are disposed in the transmission portion TA may be further reduced.

Figure 15:
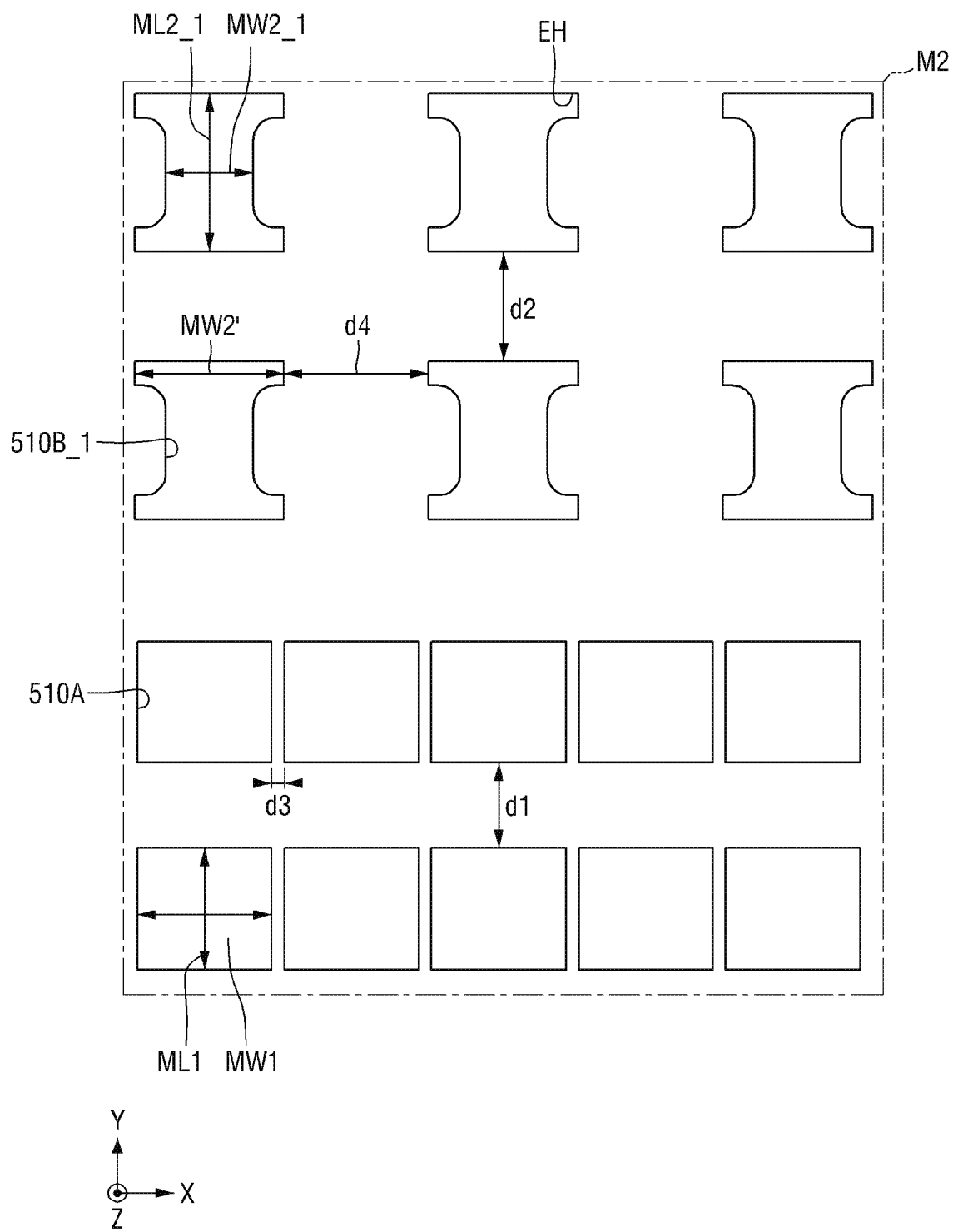
FIG. 15 illustrates a mask for forming a counter electrode according to another alternative exemplary embodiments.

FIG. 15 illustrates a mask for forming a counter electrode according to another alternative exemplary embodiments.

Figure 16:
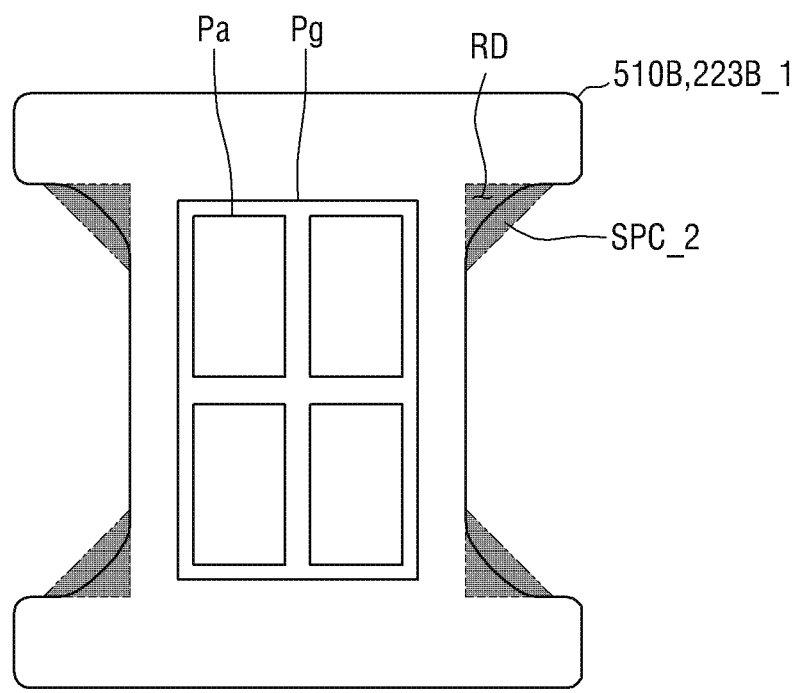
FIG. 16 is a diagram showing a planar arrangement of a second mask opening of FIG. 15.
Figure 17:
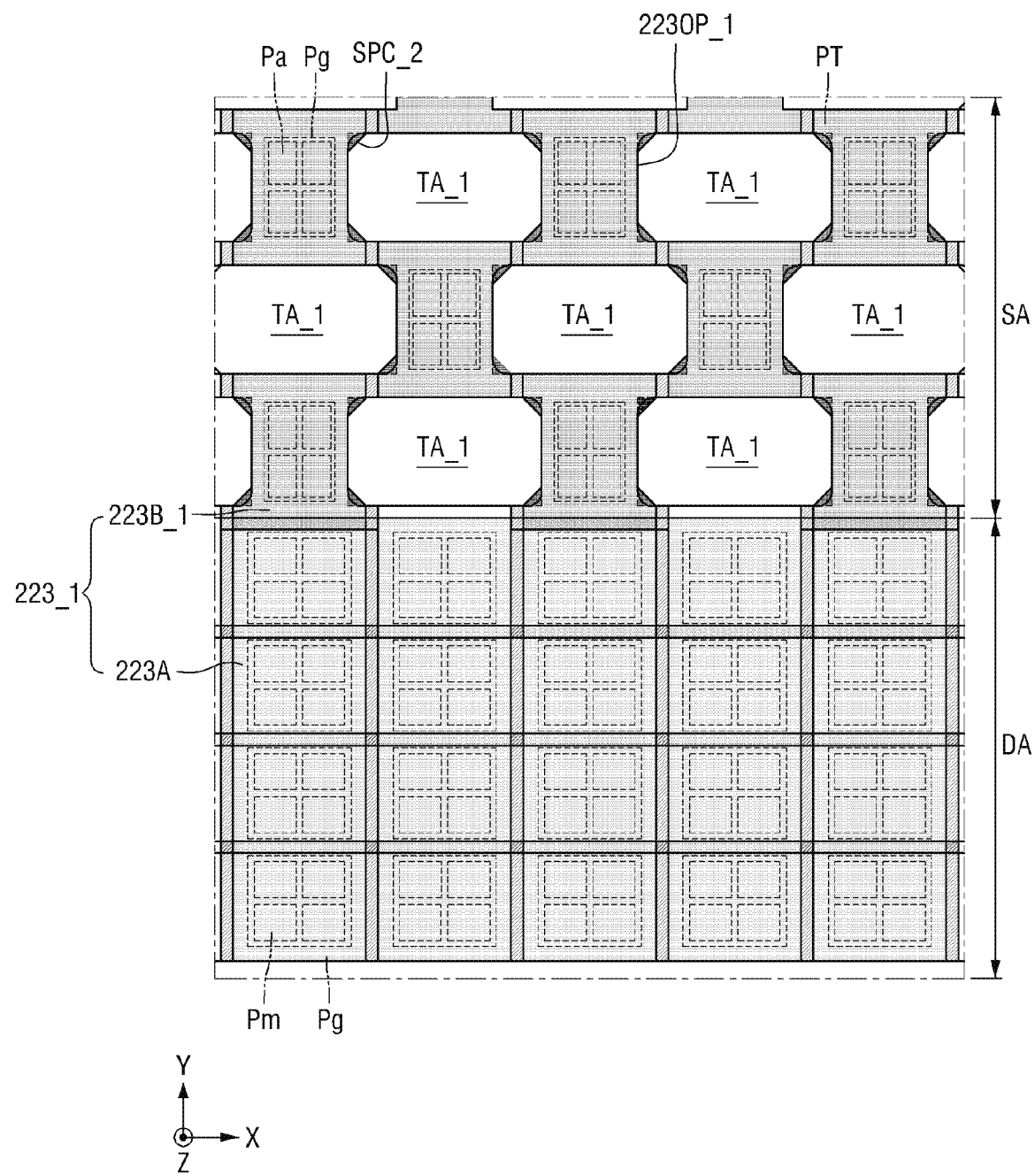
FIG. 17 is a schematic plan view corresponding to region B of FIG. 3 according to another alternative exemplary embodiment and illustrates a portion of a boundary between a display area and a sensor area.

FIG. 16 is a diagram showing a planar arrangement of a second mask opening of FIG. 15. FIG. 17 is a schematic plan view corresponding to region B of FIG. 3 according to another alternative exemplary embodiment and illustrates a portion of a boundary between a display area and a sensor area.

Referring to FIGS. 15 to 17, the shape of a second mask opening 510B_1 is different from that of the embodiment shown in FIG. 6, and thus, the shape of a spacer SPC2 is also changed, which is different from the embodiment shown in FIGS. 10 and 11.

In such an embodiment, referring to FIG. 15, includes a first mask opening 510A and a second mask opening 510B_1 having different shapes from each other are defined in a mask M2.

The first mask opening 510A may be in a rectangular shape having a first mask width MW1 in a first direction (x direction) and a first mask length ML1 in a second direction (y direction).

The second mask opening 510B_1 may include a rectangular opening having a second mask width MW2_1 in the first direction (x direction) and a second mask length ML2_1 in the second direction (y direction) and may further include expansion holes EH extending in the first direction (x direction) from the vertices of the opening. The second mask width MW2_1 may mean a width in the first direction (x direction) passing through the center of the second mask opening 510B_1. In such an embodiment, the first mask width MW1 may be larger than the second mask width MW2_1.

In such an embodiment, the second mask opening 510B_1 may further include a curved portion RD at an intersection of a region of the expansion hole EH extending in the first direction and a region of the rectangular opening extending in the second direction (y direction).

The first mask openings 510A and the second mask openings 510B_1 may be sequentially arranged along the second direction (y direction). In FIG. 15, for simplicity of description, it is illustrated that the first mask openings 510A and the second mask openings 510B_1 are arranged in two rows, respectively. However, the first mask openings 510A and the second mask openings 510B_1 may be further disposed along the second direction (y direction) at predetermined intervals. In such an embodiment, a distance d1 between the first mask openings 510A adjacent in the second direction (y direction) may be greater than the first mask length ML1, and a distance d2 between the second mask openings 510B_1 adjacent in the second direction (y direction) may be less than the first mask length ML1.

A plurality of first mask openings 510A may be provided, and each of the first mask openings 510A and the second mask openings 510B_1 may be arranged in a line at predetermined intervals along the first direction. In an exemplary embodiment, a distance d3 between the first mask openings 510A adjacent in the first direction (x direction) may be less than the first mask width MW1, and a distance d4 between the expansion holes EH of the second mask openings 510B_1 adjacent in the first direction (x direction) may be less than a width MW2' between the expansion hole EH disposed at one end of the second mask opening 510B_1 and the expansion hole EH disposed at the other end thereof.

In such an embodiment, the second mask M2 may be a mask used to deposit the counter electrodes 223 (see FIG. 11) and may be an FMM. The FMM may be manufactured by forming holes in a metal plate and then tensioning metal plate. Accordingly, the first and second mask openings 510A and 510B may be symmetrically formed with respect to an axis in the first direction passing through the center of the mask opening or an axis in the second direction passing through the center of the mask opening.

The first mask opening 510A for forming a first counter electrode 223A may have a size smaller than or equal to that of the first counter electrode 223A. The second mask opening 510B_1 for forming a second counter electrode 223B_1 may have a size smaller than or equal to that of the second counter electrode 223B_1.

FIG. 16 is a diagram showing a planar arrangement of the second mask opening 510B_1 of FIG. 15.

Referring to FIGS. 15 and 16, the second mask opening 510B_1 may entirely expose the pixel group Pg including the plurality of second pixels Pa. In such an embodiment, the second counter electrode 223B_1 formed using the second mask opening 510B_1 may be formed to entirely cover the pixel group Pg.

If the second counter electrode 223B_1 is formed not to entirely cover the pixel group Pg, the emission state of the pixel group Pg may be unstable or poor. Thus, in an exemplary embodiment, the second mask opening 510B_1 may be designed to have a size larger than that of the pixel group Pg for a process margin. In an exemplary embodiment, the second mask opening 510B_1 may further include the curved portion RD at an intersection of a region of the expansion hole EH extending in the first direction (x direction) and a region of the rectangular opening extending in the second direction (y direction). When a pattern is formed on the FMM, it is a process of forming a pattern having a very small size. Accordingly, it may be difficult to form the pattern as designed. The curved portion RD may be an error occurring at a corner portion.

In such an embodiment, it is desired to minimize the overlapping arrangement of the second counter electrode 223B_1 and the transmission portion TA to improve the transmittance of the transmission portion TA. Therefore, a spacer SPC_2 may be disposed to correspond to the curved portion RD, which is an error occurring at the corner portion.

FIG. 17 is a schematic plan view corresponding to region B of FIG. 3 according to another alternative exemplary embodiment and illustrates a portion of a boundary between a display area and a sensor area.

In an exemplary embodiment, referring to FIG. 17, a display device includes a display area DA including a plurality of first pixels Pm, and a sensor area SA including a plurality of second pixels Pa and transmission portions TA, and includes a plurality of counter electrodes 223_1. The counter electrodes 223_1 may include a plurality of first counter electrodes 223A disposed corresponding to the display area DA, and a plurality of second counter electrodes 223B_1 disposed corresponding to the sensor area SA. The shape of the plurality of first counter electrodes 223A may be different from the shape of the plurality of second counter electrodes 223B_1. The counter electrodes 223_1 may be connected to each other, and the thickness of the counter electrode 223_1 at the connection portion may be larger.

Each of the first and second counter electrodes 223A and 223B_1 may be disposed corresponding to one pixel group Pg.

The pixel group Pg may include at least one pixel Pa or Pm. FIG. 17 illustrates that one pixel group Pg includes four pixels Pa and Pm arranged in two rows. However, the disclosure is not limited thereto. In such an embodiment, the number and arrangement of pixels Pa and Pm included in one pixel group Pg may be variously modified. In one exemplary embodiment, for example, one pixel group Pg may include three pixels Pa, Pm arranged side by side in one row, or eight pixels Pa, Pm arranged in four rows. Herein, the pixel Pa, Pm may mean a subpixel that emits red, green or blue light.

A transmission portion TA_1 is a region having high light transmittance because no display element is disposed and may be provided in plural in the sensor area SA. The transmission portions TA_1 may be disposed alternately with the pixel groups Pg along the first direction x and/or the second direction y. Alternatively, the transmission portions TA_1 may be disposed to surround the pixel group Pg. Alternatively, the second pixels Pa may be disposed to surround the transmission portion TA_1. In such an embodiment, the transmission portion TA_1 is a region where the first and second counter electrodes 223A and 223B_1 are not disposed, and may refer to a region corresponding to an opening 2230P_1 of the counter electrode 223_1 in the sensor area SA.

The size of the transmission portion TA_1 may be larger than that of an emission region of at least one pixel Pa, Pm. In an exemplary embodiment, the size of the transmission portion TA_1 may be larger than or equal to the size of one pixel group Pg.

The first and second counter electrodes 223A and 223B_1 may be electrically connected to each other.

Among the first counter electrodes 223A, the first counter electrodes 223A adjacent to each other in the first direction (x direction) and the second direction (y direction) may overlap and contact each other at edges thereof. Referring to FIG. 15, the first mask openings 510A are spaced apart from each other by the predetermined distance d3 in the first direction (x direction) and spaced apart from each other by the predetermined distance d1 in the second direction (y direction). However, when the deposition material is deposited, the deposition material may be disposed to overlap each other due to a shadow phenomenon or the like. Accordingly, the first counter electrodes 223A may be in contact with each other in the first direction (x direction) and the second direction (y direction), and may be electrically connected to the second power supply wiring 170 (see FIG. 3) of the non-display area NDA. The second counter electrodes 223B_1 are disposed to surround the transmission portion TA_1. Among the second counter electrodes 223B_1 surrounding the transmission portion TA_1, the second counter electrodes 223B_1 disposed adjacent to each other along the edge of the transmission portion TA_1 may be configured in a way such that protrusions PT protruding from the vertices in the first direction (x direction) overlap and contact each other. The second counter electrodes 223B_1 connected to each other may be electrically connected to the second power supply wiring 170 (see FIG. 3) of the non-display area NDA.

In an exemplary embodiment, the second counter electrode 223B_1 may further include a curved portion RD at an intersection of a region of a protrusion PT_1 extending in the first direction (x direction) and a region of a rectangular opening extending in the second direction (y direction). The spacer SPC_2 may have a triangular shape and may be disposed to at least partially overlap the curved portion RD.

In such an embodiment, it may be understood that the second counter electrodes 223B_1 arranged along the first direction x are spaced apart from each other with the transmission portion TA_1 interposed therebetween, and the second counter electrodes 223B_1 arranged along the second direction y are spaced apart from each other with the transmission portion TA interposed therebetween. In this case, it may be understood that the second counter electrodes 223B_1 disposed adjacent to each other in the second direction (y direction) overlap and contact each other at the protrusions PT.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
   a substrate including:
      a display area including a plurality of first pixels; and
      a sensor area including a plurality of second pixels and a plurality of transmission portions;
   a plurality of first counter electrodes disposed corresponding to the plurality of first pixels, respectively;
   a plurality of second counter electrodes disposed corresponding to the plurality of second pixels, respectively; and
   a spacer disposed to overlap at least a portion of a boundary region between a transmission portion of the plurality of transmission portions and a second counter electrode of the plurality of second counter electrodes, which are adjacent to each other.

2. The display device of claim 1, wherein the spacer includes at least one organic material selected from polyimide, polyamide and acrylic resin and phenol resin.

3. The display device of claim 1, further comprising:
   a component disposed below the transmission portion,
   wherein the component includes a sensor which senses an infrared light, a visible light or a sound.

4. The display device of claim 1, wherein an area of the plurality of transmission portions is greater than an area of an emission region of the plurality of second pixel.

5. The display device of claim 1, wherein the number of the plurality of second pixels per unit area is less than the number of the plurality of first pixels per unit area.

6. The display device of claim 1, wherein the plurality of first counter electrodes and the plurality of second counter electrodes are electrically connected to each other.

7. The display device of claim 1, wherein
   each of the plurality of first counter electrodes has a first rectangular shape having a first width in a first direction and a first height in a second direction crossing the first direction, and
   each of the plurality of second counter electrodes has a second rectangular shape with protrusions protruding in the first direction from four vertices of the second rectangular shape, and
   the second rectangular shape has a second width in the first direction and a second height in the second direction.

8. The display device of claim 7, wherein
   the first width is greater than the second width, and
   the first height is less than the second height.

9. The display device of claim 8, wherein each of the plurality of transmission portions has a third rectangular shape surrounded by the plurality of second counter electrodes.

10. The display device of claim 9, wherein the third rectangular shape has a third width in the first direction and has a third height in the second direction.

11. The display device of claim 10, wherein the third width is greater than the first width and the second width.

12. The display device of claim 9, wherein
the spacer has a predetermined width, and
the spacer is disposed to at least partially overlap a boundary region between the transmission portion and the protrusions of the second counter electrode in the first direction and a boundary region between the transmission portion and the second rectangular shape of the second counter electrode in the second direction.

13. The display device of claim 9, wherein
the spacer has a predetermined width, and
the spacer is disposed along a perimeter of the third rectangular shape.

14. The display device of claim 8, wherein each of the plurality of second counter electrodes further include a curved portion at an intersection of a region of the protrusion extending in the first direction and a region of the second rectangular shape extending in the second direction.

15. The display device of claim 14, wherein
the spacer has a triangular shape, and
the spacer is disposed to at least partially overlap the curved portion.

16. The display device of claim 7, wherein
adjacent first counter electrodes in the first direction, among the plurality of first counter electrodes, overlap each other at an edge of the first rectangular shape, and
adjacent second counter electrodes along an edge of the transmission portion, among the plurality of second counter electrodes, overlap each other at the protrusion.

17. The display device of claim 7, wherein adjacent first counter electrodes in the second direction, among the plurality of first counter electrodes, are spaced apart from each other.

18. The display device of claim 7, wherein the substrate further includes a non-display area disposed to surround the display area and the sensor area.

19. The display device of claim 18, wherein a power supply wiring extending in the second direction is disposed on the non-display area of the substrate.

20. The display device of claim 19, wherein the plurality of first counter electrodes spaced apart from each other in the second direction are electrically connected to each other through the power supply wiring.

* * * * *